US011605527B2

(12) United States Patent
De Chambrier et al.

(10) Patent No.: US 11,605,527 B2
(45) Date of Patent: Mar. 14, 2023

(54) PULSING CONTROL MATCH NETWORK

(71) Applicant: COMET TECHNOLOGIES USA, INC., San Jose, CA (US)

(72) Inventors: Alexandre De Chambrier, San Jose, CA (US); Stephen E. Savas, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 96 days.

(21) Appl. No.: 17/152,625

(22) Filed: Jan. 19, 2021

(65) Prior Publication Data

US 2021/0225613 A1    Jul. 22, 2021

Related U.S. Application Data

(60) Provisional application No. 62/963,426, filed on Jan. 20, 2020.

(51) Int. Cl.
*H01J 37/32* (2006.01)

(52) U.S. Cl.
CPC .. *H01J 37/32183* (2013.01); *H01J 37/32146* (2013.01); *H01J 2237/24564* (2013.01)

(58) Field of Classification Search
CPC .......... H01J 37/32183; H01J 37/32146; H01J 2237/24564
See application file for complete search history.

(56) References Cited

U.S. PATENT DOCUMENTS

| | | | |
|---|---|---|---|
| 4,679,007 A | 7/1987 | Reese et al. | |
| 5,175,472 A | 12/1992 | Johnson, Jr. et al. | |
| 5,195,045 A | 3/1993 | Keane et al. | |
| 5,394,061 A | 2/1995 | Fujii | |
| 5,474,648 A | 12/1995 | Patrick et al. | |
| 5,576,629 A | 11/1996 | Turner et al. | |
| 5,609,737 A | 3/1997 | Fukui et al. | |
| 5,629,653 A | 5/1997 | Stimson | |
| 5,737,175 A | 4/1998 | Grosshart et al. | |

(Continued)

FOREIGN PATENT DOCUMENTS

| | | | |
|---|---|---|---|
| JP | 04239211 A | 8/1992 | |
| JP | 05284046 A | 8/1993 | |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Henry Luong
(74) *Attorney, Agent, or Firm* — Nolte Lackenbach Siegel

(57) ABSTRACT

A method of controlling a radio frequency processing system, the method including determining an end time of a radio frequency pulse; stopping a load applied to the radio frequency processing system based on the end time of the radio frequency pulse; adjusting an additional load having a predetermined impedance applied to the radio frequency processing system in response to the determined end time; determining a start point of a second radio frequency pulse; and stopping the additional load before the second radio frequency pulse occurs.

11 Claims, 19 Drawing Sheets

(56) References Cited

U.S. PATENT DOCUMENTS

| | | |
|---|---|---|
| 5,792,261 A | 8/1998 | Hama et al. |
| 5,810,963 A | 9/1998 | Tomioka |
| 5,842,154 A | 11/1998 | Harnett et al. |
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 | 11/2001 | Johnson et al. |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,455,437 B1 | 9/2002 | Davidow et al. |
| 6,463,875 B1 | 10/2002 | Chen et al. |
| 6,507,155 B1 | 1/2003 | Barnes et al. |
| 6,677,828 B1 | 1/2004 | Harnett et al. |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman |
| 6,949,887 B2 | 9/2005 | Kirkpatrick et al. |
| 7,030,335 B2 | 4/2006 | Hoffman |
| 7,042,311 B1 | 5/2006 | Hilliker et al. |
| 7,079,597 B1 | 7/2006 | Kenwood |
| 7,102,292 B2 | 9/2006 | Parsons et al. |
| 7,192,505 B2 | 3/2007 | Roche et al. |
| 7,196,283 B2 | 3/2007 | Buchberger, Jr. |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,466,622 B2 | 6/2013 | Knaus |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilie |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli et al. |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley et al. |
| 9,577,516 B1 | 2/2017 | Van Zyl et al. |
| 9,578,731 B2 | 2/2017 | Hoffman et al. |
| 9,584,090 B2 | 2/2017 | Mavretic |
| 9,591,739 B2 | 3/2017 | Bhutta |
| 9,589,767 B2 | 4/2017 | Finley et al. |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Kamstedt |
| 10,194,518 B2 | 1/2019 | Van Zyl et al. |
| 10,217,618 B2 | 2/2019 | Larson et al. |
| 10,224,184 B2 | 3/2019 | Van Zyl et al. |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney et al. |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 2003/0121609 A1 | 7/2003 | Ohmi et al. |
| 2003/0150710 A1 | 8/2003 | Evans et al. |
| 2003/0230984 A1 | 12/2003 | Kitamura et al. |
| 2004/0016402 A1 | 1/2004 | Walther et al. |
| 2004/0026235 A1 | 2/2004 | Stowell, Jr. |
| 2005/0034811 A1 | 2/2005 | Mahoney et al. |
| 2005/0045475 A1 | 3/2005 | Wantanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |
| 2006/0249729 A1 | 11/2006 | Mundt et al. |
| 2007/0121267 A1 | 5/2007 | Kotani |
| 2007/0222428 A1 | 9/2007 | Garvin et al. |
| 2008/0061793 A1 | 3/2008 | Anwar et al. |
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |

(56) References Cited

U.S. PATENT DOCUMENTS

| | | |
|---|---|---|
| 2008/0317974 A1 | 12/2008 | de Vries |
| 2009/0026964 A1 | 1/2009 | Knaus |
| 2009/0206974 A1 | 8/2009 | Meinke |
| 2010/0012029 A1 | 1/2010 | Forester et al. |
| 2010/0072172 A1 | 3/2010 | Ui et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0213620 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2019/0172683 A1 | 6/2019 | Mavretic |
| 2019/0199241 A1 | 6/2019 | Satoshi et al. |
| 2019/0385822 A1 | 12/2019 | Marakhtanov et al. |
| 2020/0212893 A1* | 7/2020 | Morii ............... H03H 11/30 |

FOREIGN PATENT DOCUMENTS

| | | | |
|---|---|---|---|
| JP | 2006-310245 A | 6/2008 | |
| JP | 2010-016124 A | 1/2010 | |
| JP | 2015-502213 A | 1/2015 | |
| KR | 10-2006-0067957 A | 6/2006 | |
| KR | 10-2014-0077866 A | 6/2014 | |
| KR | 10-2017-0127724 A | 11/2017 | |
| KR | 10-2018-0038596 A | 4/2018 | |
| WO | 2012054305 | 4/2012 | |
| WO | 2012054306 | 4/2012 | |
| WO | 2012054307 | 4/2012 | |
| WO | 2016048449 A1 | 3/2016 | |
| WO | 2016097730 | 6/2016 | |
| WO | 2019096564 A1 | 5/2019 | |
| WO | 2019147513 A1 | 8/2019 | |
| WO | 2019-244734 A1 | 12/2019 | |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

* cited by examiner

PULSING CONTROL MATCH NETWORK

CROSS-REFERENCE TO RELATED APPLICATION

This application claims priority to U.S. Provisional Application. No. 62/963,426 filed Jan. 20, 2020, the contents of which are incorporated herein by reference.

BACKGROUND

Radio frequency (RF) Plasma-enhanced processing is extensively used in semiconductor manufacturing to etch different types of films, deposit thin films at low to intermediate processing temperatures and perform surface treatment and cleaning. Characteristic of such processes is the employment of a plasma, i.e., a partially ionized gas, that is used to generate neutral species and ions from precursors inside a reaction chamber, provide energy for ion bombardment, and/or perform other actions.

Non-uniform plasma densities within a reaction chamber may cause uneven etch rates or certain characteristics across a substrate. In certain systems, monitoring plasma density uniformity within a reaction chamber occurs with probes. Such probes may be exposed to the plasma environment rely on coatings and may use active electronics to infer plasma density. Such systems may take milliseconds or more to respond to changes in the plasma. Emission spectroscopy may also be used to determine the profile of plasma density within a reaction chamber, but such system may require multiple lines of sight through the plasma and use complicated analysis to infer non-uniformity. Neither of these techniques are sensitive and fast enough to effectively resolve the non-uniformity issues and may further be costly to implement.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Figure 1:
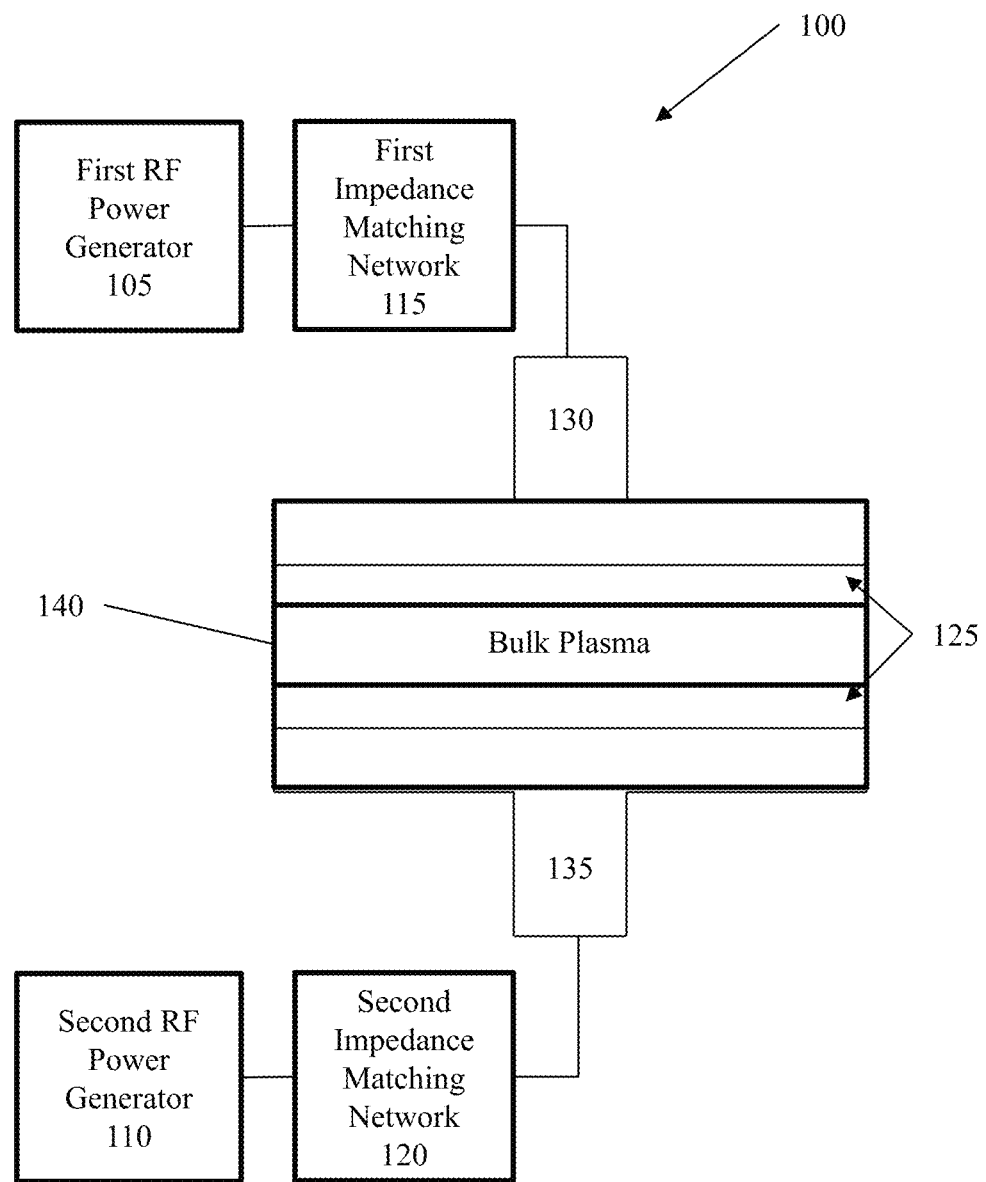
FIG. 1 is a side view schematic representation of a RF plasma processing system according to embodiments of the present disclosure.

Turning to FIG. 1, a side view schematic representation of a RF plasma processing system 100, according to embodiments of the present disclosure is shown. RF plasma processing system 100 includes a first RF generator 105 and a second RF generator 110, a first impedance matching network 115, a second impedance matching network 120, a sheath 125, a plasma powering device, such as showerhead 130 or equivalent powered element such as an electrode, and a pedestal 135. As used herein, plasma power devices may refer to any device that introduces power to generate plasma and may include, for example, showerhead 130 and/or other types of electrodes, as well as antenna and the like.

RF plasma processing system 100 may include one or more RF generators 105, 110 that deliver power to a reaction chamber 140 through one or more impedance matching networks 115, 120. RF power flows from the first RF generator 105 through the impedance matching network 115 into plasma in reaction chamber 140 to showerhead 130 or sidewall, to an electrode other than showerhead 130, or to an inductive antenna (not shown) that electromagnetically provides power to the plasma, where after the power flows from the plasma to ground and/or to pedestal 135 and/or to second impedance matching network 120. Generally, first impedance matching network 115 compensates for variations in a load impedance inside reaction chamber 140 so the combined impedance of showerhead 130 and first impedance matching network 115 equal the output impedance of first RF generator 105, e.g., 50 ohms, by adjusting the reactive components, e.g., variable capacitors, within first impedance matching network 115. The term "about" is acknowledgement that, in practice, some imprecision relative to the range may be experienced and yet obtain satisfactory result. Such imprecision may result from, for example, a loss of calibration or drift during operation. In these situations, however, the expressed range is the nominal target for operational conditions when in use.

In certain examples, first RF generator 105 may provide power at a RF frequency between about 400 KHz and 150 MHz, while second RF generator 110 connected to pedestal 135 may supply power at a RF frequency lower than that of first RF generator 105, however, in certain implementations, second RF generator 110 may not supply power at a RF frequency lower than that of first RF generator 105. Typically, the frequencies of first and second RF generators 105, 110 is such that first RF generator 105 is at a RF frequency that is not an integer multiple, nor integer fraction, of the frequency of second RF generator 110.

Impedance matching networks 115, 120 are designed to make adjustments to their internal reactive elements such that the load impedance matches the source impedance. Generally, low reflected power is considered positive, however, embodiments of the present disclosure ensure that the delivered power is maintained in reaction chamber 140, and that power that is reflected back towards first and second RF generators 105, 110, and that even when the reflected power is relatively high, the associated impedance matching networks 115, 120 may monitor forward and reflected power to and from reaction chamber 140 and, using motor-driver systems, make adjustments to adjustable reactive elements, e.g., vacuum variable capacitors. Impedance matching networks 115, 120 may contain circuitry to measure phase and magnitude of signals to determine the levels of forward and reflected power from the intended load. As such, embodiments of the present disclosure may be effective even when the amount of reflected power is high. If there is a significant amount of reflected power at a primary frequency, capacitors are varied until the reflected power is minimized, for example to less than about 5 Watts and/or less than about 1 percent for the period, or in certain embodiments, to less than 1 Watt. Typically, harmonic frequency signals are not measured, including the reflected power at harmonic frequencies.

Although RF plasma processing systems 100 have many advantages, they have historically been challenged to maintain control of plasma density throughout a multi-step process. Design tolerances on the order of one percent non-uniformity, for example, with a density range of the same order relative to a nominal value remain a challenge. Achieving optimal integrated circuit (IC) yields on each and every wafer as the feature size shrinks below about 10 nm and the layer thicknesses are less than 50 nm requires progressively tighter control of the uniformity of the plasma and neutral species to the 1% level and even less. Non-uniform plasma densities, or average densities deviating from the desired value by more than a desired range within reaction chambers may be caused by slow changes in the chamber, changes in the RF circuit, or the rapid growth (on the order of less than a millisecond) of parasitic or secondary plasmas which can lead to non-uniformities of nano-scale features across a processed wafer due to uneven etch rates.

Because even a difference in an etch rate of one percent across a wafer can cause yield problems for advanced technologies, and because it often takes a substantial amount of time to complete wafer processing to see the yield loss, a need exists to promptly and accurately detect non-uniform plasma densities or plasma density that deviates from the desired range within a reaction chamber in a time period that may need to be less than about 1 millisecond to avoid irreversible deviations on the wafer from desired feature profile.

Those of ordinary skill in the art will appreciate that electromagnetic (EM) surface waves may propagate on surfaces within an RF powered plasma in reaction chamber 140. These surface waves will have appreciable energy at both the fundamental RF drive frequency and RF harmonics. The harmonic waves' average power and power distribution are sensitive functions of plasma density and non-uniformity. Herein, a harmonic wave profile is defined as the spectrum of surface waves having frequencies that are integer multiples of the fundamental drive frequency for an RF plasma-based reaction chamber 140. For example, if 2 MHz RF drive power is provided to reaction chamber 140, the injected power will generate surface waves at that frequency that propagate along interfaces between plasma and interior reaction chamber 140 surfaces. Harmonic surface waves of integer multiple frequencies may also be generated. For example, 2 MHz electromagnetic waves may generate 4, 6, or 8 MHz surface waves. Both odd and even harmonics (2nd, 3rd, 4th, 5th, etc.) may appear, but in some examples the odd harmonics may be dominant.

Aspects of the present disclosure may provide sensor locations on and about reaction chamber 140 and components thereof that may allow for detecting and analyzing RF surface waves to find amplitudes and phases of fundamental and harmonics at a plurality of points within or adjacent reaction chamber 140. The waves may be detected by sensing the rf voltage or rf current at fundamental and harmonic frequencies on the surface of a chamber component. In some embodiments a sensor for voltage will include a pickup that is configured at, or proximate to, the surface of the electrode, pedestal base, chamber wall, or strap, and a conducting line that conveys the signal from the pickup to a connector or cable. A current sensor may include a conducting element that may include one or more loops or partial loops or a linear conductor, where one end of the conducting element is at a reference potential that may be local electrical ground.

A plurality of sensors, e.g., two or more, may be positioned upon certain chamber component, which will be discussed in detail below, at different angles about a chamber symmetry axis for measuring the surface voltage or current associated with such surface waves. Herein, an angle measured about the symmetry axis from a reference point of the chamber is defined as an azimuth. In some embodiments such sensors may be positioned at approximately the same distance from the symmetry axis of the chamber.

Sensors may be mounted in various locations on or about reaction chamber and/or components thereof. For example, sensors may be mounted on the surface of an electrode, such as pedestal 135 and/or showerhead 130. Sensors may also be mounted on a base of an electrode either within the vacuum or outside the vacuum environment. Sensors may be mounted inside the chamber on one or more metal wall surfaces of the reaction chamber 140, and inside or outside wall areas that contain a dielectric material, or on an antenna that may be used for inductively providing power into the plasma. Sensors may also be placed on a passive antenna that may be used for sensing the EM waves proximate the boundary of the plasma or upon or proximate a plurality of conducting busses or straps connecting first or second impedance matching network 115, 120 to an electrode, such as pedestal 135 and/or showerhead 130, antenna, or other components that transmits power to plasma within reaction chamber 140. Sensors may also be connected to an electrical ground. The sensors may thereby pick up signals from different parts of RF plasma processing system 100 as they propagate on respective component surfaces.

A spectrum of RF harmonic waves is generated at the electrode-plasma interface, e.g., sheath 125 in FIG. 1 and waves propagate in all directions so that both amplitudes and phases of all wave components will vary with location on an electrode or support base. Such waves also propagate along the inner surface of a metal wall adjacent the plasma and propagate through any dielectric wall that may be adjacent plasma. Such wave amplitudes and phases change in response to changes of the plasma, e.g., plasma density and non-uniformity, with response times on the order of or less than a few microseconds. Further, the frequency and phase distributions of RF harmonic surface waves that propagate on the electrode-plasma interface determine the frequency and phase distributions of harmonic surface waves that propagate on the surface of an electrode base toward impedance matching networks 115, 120, on surfaces connected to an electrode or plasma-wall interface, or on walls. The amplitudes and phases of the signals for fundamental and harmonic waves at the different sensor locations permit determination of what part of the total EM wave field for each frequency is azimuthally symmetric and what part is non-symmetric.

In the case of inductive plasma, signals from the plasma, e.g., fundamental and harmonic, may propagate back to an antenna and then to the impedance matching network feeding power to the antenna. The frequency and phase distributions of both fundamental and harmonic RF waves may be monitored on a microsecond or faster timescale using sensors mounted on such surfaces and may be compared with specified ranges and phase relationships as indicators of plasma asymmetry or changes in plasma density or electrical conductivity. Signals from such sensors may be transmitted, by cables, or otherwise, to detectors that analyze the signal's component frequencies to produce the amplitude and phase values for each frequency component at each sensor location.

In certain implementations, the amplitudes and phases of the detected RF harmonic components may be rapidly determined by circuits (detectors) in a signal analysis compartment that may be a separate metal box or chassis, or that may be within or connected to or part of impedance matching networks 115, 120. Such amplitudes and phases may be used to determine the status, including the radial distribution and the asymmetry of plasma by applying algorithms and plasma non-uniformity calibrations. The signals from the sensors may be Fourier analyzed by dedicated circuits (detectors) that are fast enough to perform virtually continuous spectrum analysis, updating as frequently as possible and yielding a high-rate data stream. For example, for plasma power at 13.56 MHz, 512 periods may take less than 50 microseconds to process through Fourier analysis, and for pulsed plasmas when each element of the pulse occurs at 5 KHz, this allows for updates of plasma status at a rate of 10 KHz.

The results of the dedicated Fourier analyses of fundamental and harmonic waves may be stored on a separate storage medium that may be read and/or written to by an analysis processor associated with the signal analysis compartment. Either stored results or a real-time signals may be routed to high speed computational processors to determine asymmetry parameters for each of fundamental and harmonic waves. The asymmetry parameters may be compared to values previously stored on the separate storage medium (or on a different storage medium) using algorithms (which may also be stored on the separate storage medium or on a different storage medium) to very rapidly recognize a "Plasma Fault" condition. The analysis processor then may transmit an appropriate command, e.g., to continue the process under the present conditions, or to make needed changes in the process conditions, to first and second RF generators 105, 110, and in certain implementations, more than just two RF generators and when appropriate to the impedance matching networks associated with these generators. In certain implementations, three, four, or more RF generators may be used. First and second RF generators 105,110 may then continue, stop, change the power provided, or respond in some other suitable way—for example, going into a reduced-power mode or a pulsed mode, or ordering certain corrective actions, e.g., alarm triggering, power interruption, etc., to avoid improper wafer processing during a Plasma Fault or other unacceptable situation.

The location of sensors for detecting (electric and magnetic fields of) and characterizing surface waves may, in some embodiments, be on peripheral surfaces (bare or covered by dielectric) of the pedestal 135 outside the area covered by the wafer. For example, if reaction chamber 140 is to process circular wafers of radius 150 mm, the pedestal-mounted sensors may be located at radii greater than 150 mm from the wafer center which may in some cases be under an annular peripheral dielectric for controlling edge effects. Sensors may additionally or alternatively be located on the surface or periphery of the showerhead 130 facing the wafer or on the surface of the base of the pedestal 135 or the base of showerhead 130, whether these locations are within or outside the evacuated process environment. Sensors may also be located at various other locations, which will be discussed in detail below, and may monitor continuously or periodically to provide uniformity of the process plasma.

Using sensors outside the evacuated process environment, e.g., in the straps or busses connecting the base to one or more of impedance matching networks 115, 120, the base of pedestal 135 and/or showerhead 130, may not require passing signals through a vacuum feedthrough or installing transmission cables within the evacuated volume of reaction chamber 140. Sensors in such locations may monitor the fundamental and harmonic EM waves substantially continuously. This may enable an RF plasma processing system 100 to continuously provide plasma density uniformity and determine within a very brief time whether a fault condition has occurred or whether proper wafer or substrate processing continues.

In certain example implementations, the present disclosure may provide apparatuses and methods for detecting deviations of the plasma from the required "process window" within an RF plasma processing system 100. The RF plasma processing system 100 may include reaction chamber 140, which may include showerhead 130 for injecting reactant gases into reaction chamber 140, and which may also include a wafer-support pedestal 135. However, in other implementations, showerhead 130 may not inject gas into reaction chamber 140. In some embodiments showerhead 130 may be mounted with its center near the approximate symmetry axis of reaction chamber 140 and equipped with a plurality of sensors positioned at selected azimuths around the symmetry axis. Additionally or alternatively, such sensors may be positioned on the wafer-facing surface in peripheral areas of showerhead 130 to detect and measure propagating EM surface waves while wafers are being processed.

Further, in some embodiments, there may be a plurality of sensors that are mounted on the outer surface of the wafer support pedestal 135, outside the area occupied by the wafer, for detecting both amplitude and phase of the RF harmonics and fundamental surface waves. Such sensors may be exposed to plasma or may be covered by dielectric, or dielectric-and-metal, covers. Additionally or alternatively, sensors may be situated on the periphery of the pedestal 135 base, within or outside the evacuated volume and/or below the plane defined by the wafer. In some implementations, the sensors may be positioned on the pedestal base to detect surface electromagnetic waves propagating toward or away from the wafer-supporting area of the pedestal and on the surface of the pedestal base. In certain embodiments, the sensors may be mounted close to the wafer plane (e.g., less than 10 centimeters).

Alternatively, sensors may be mounted on a part of pedestal 135 that is metal or another electrically conductive material and located outside the evacuated region of reaction chamber 140 in atmospheric conditions. Sensors located outside the evacuated region may be mounted on a region of pedestal 135 at a radius from the pedestal symmetry axis that is at least 50% of the maximal pedestal 135 radius, or even more than 75% of the maximum pedestal 135 radius. Such sensors may be positioned close—in some embodiments within a few centimeters of the vacuum seal for the support pedestal 135, e.g., the O-ring. In some embodiments, the total of radial and axial propagation distance from the edge of the wafer to the sensors may be less than about 25 cm, or in some embodiments less than about 15 cm, or even about 10 cm. Specific locations and orientations of sensors according to embodiments of the present disclosure will be discussed in detail below.

Figure 2:
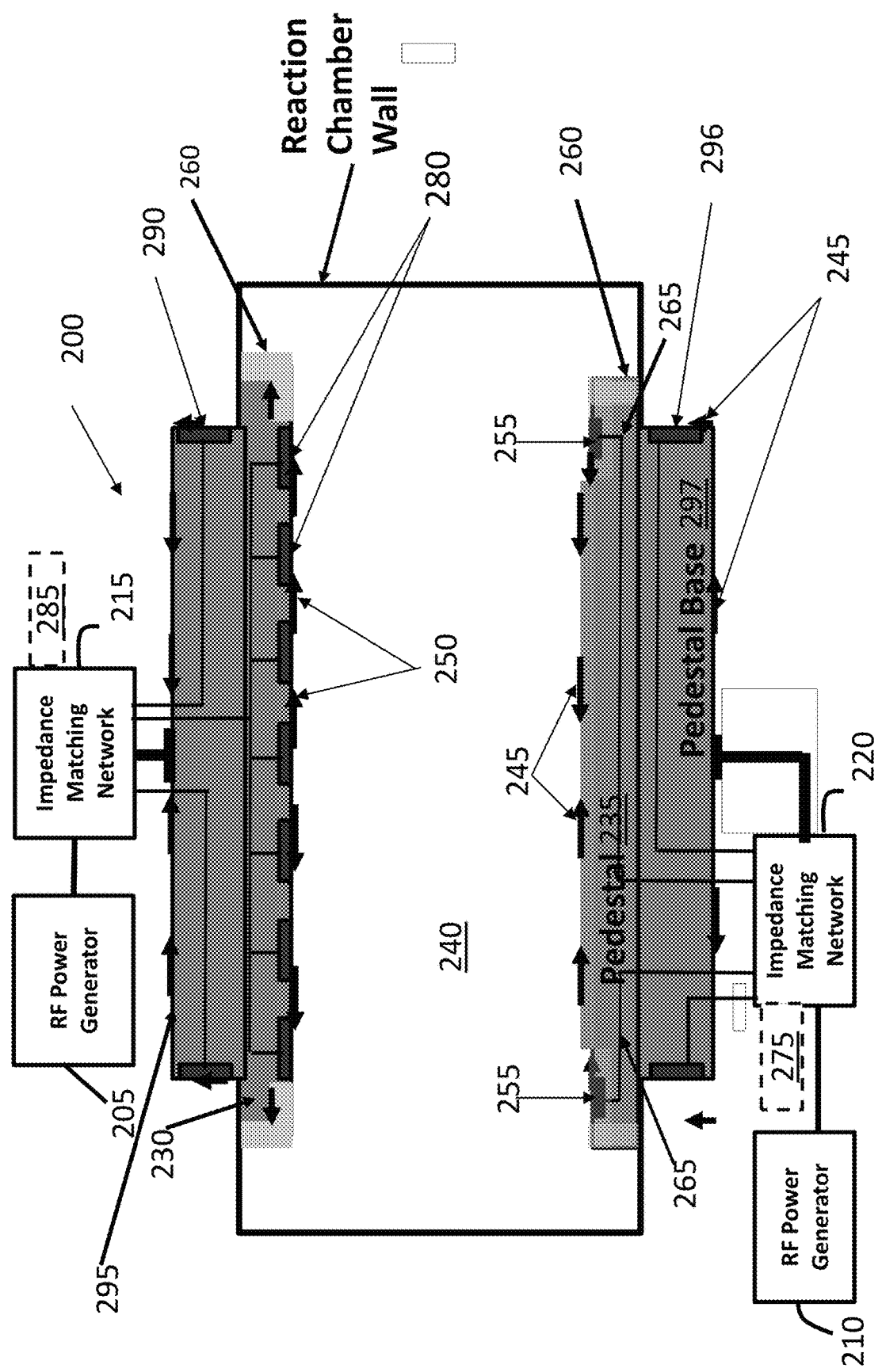
FIG. 2 is a schematic side view of a plasma chamber with high bandwidth sensors mounted in various positions on the electrodes in accordance with embodiments of the present disclosure.

Turning to FIG. 2, a schematic side view of a plasma chamber with high impedance sensors mounted in various positions on the electrodes in accordance with embodiments of the present disclosure is shown. Each of two components serving as electrodes, i.e., pedestal 235 and showerhead 230, or equivalent other powered element may use a separate RF generator 205 or 210 and impedance matching networks 215 and 220. Alternatively, an electrode may have a plurality of generators and matching networks feeding power thereto. Arrows 245 along the surface of pedestal 235 indicate the inward radial direction of RF current and power flow from the bottom (bias) RF generator 210 that is connected electrically through the impedance matching network 220 to pedestal 235. The electric field created contributes to the formation of a plasma (not shown) between the electrodes and a radial outward counterflow of current and power, indicated by arrows 250, along the lower surface of showerhead 235 or other powered element and ultimately to a selective grounding circuit in impedance matching network 215 for showerhead 230 or the other powered element.

In certain embodiments, reaction chamber 240, having RF power from first and second RF generators 205, 210 and impedance matching networks 215, 220 may include sensors 255 on the periphery of pedestal 235 that may be covered by dielectric 260. Communication lines 265 may transmit signals from each of sensors 255, that in some embodiments may be approximately equidistant from the pedestal symmetry axis, to Fourier analysis circuits (not shown) that compute amplitude and phase of both fundamental frequency and harmonic frequency surface waves picked up by each sensor 255.

In some implementations, the Fourier analysis circuits may calculate magnitudes and phases of the fundamental and higher order harmonics of the periodic, electro-magnetic surface waveforms. The resulting series of magnitudes, known as a Fourier series, and their phases results from the relation between a function in the domain of time and a function in the domain of frequency.

Further, some of the embodiments of the disclosed matching network 220 may contain a signal analysis compartment 275 or appendage of the matching network 220 that is separate and RF isolated from the RF power handling and impedance matching circuitry or components of the matching network 220. The signal analysis compartment 275 may contain Fourier analysis circuit(s) (detectors) for analyzing sensor signals and yielding digital amplitudes and phases of RF fundamental and harmonic waves. Signal analysis compartment 275 may also contain high speed digital logic or computation processors for analyzing the relative magnitudes and phases of signals at harmonic frequencies and deriving quantitative parameters that characterize the relative magnitudes of axisymmetric and non-axisymmetric harmonic components at each frequency, and their relative phases. Furthermore, in some embodiments, the disclosed matching network 220 may be connected via a very fast network to the second RF generator 210 as well as the controller (not shown) for the reaction chamber 240 or RF plasma processing system 200 wherein sensors 255 are located. In some embodiments the disclosed enhanced impedance matching network 220 may be capable of sending commands to the first RF generator 205 as well as communicating its calculated parameters to the processing chamber controller and/or to the tool control system.

In addition, another, first RF generator 205 and impedance matching network 215 may also be electrically coupled to the other electrode, which may be a showerhead 230 in reaction chamber 240. In one implementation, the first RF generator 205 may operate at different frequency than second RF generator 210, and its frequency may not be an integer multiple of the frequency of the second RF generator 210.

Similarly, impedance matching network 215 monitors the reflected power from the electrode and processing chamber 240 and may make adjustments if there is significant reflected power from the electrode. In some embodiments, the second RF generator 210 may be a 400 KHz RF generator, a 2 MHz RF generator, or a 13.56 MHz RF generator or other, while the first RF generator 205 may operate at a somewhat higher frequency. In some embodiments, first RF generator 205 may operate at a frequency greater than 25 MHz, such as 60 MHz, 100 MHz, or higher.

In one embodiment, the primary function of the first RF generator 205 may be to power the reaction chamber 240 to generate plasma between the showerhead 230 or another power source such as an electrode and pedestal 235, both to generate reactive chemical species such as fluorine or chlorine and to cause ions from the generated plasma to accelerate and strike a wafer disposed on the pedestal 235.

Disposed on the upper electrode surface, i.e., showerhead 230, facing the lower electrode, i.e., pedestal 235, may be a set of sensors 280 having bandwidth greater than about 10 times the frequency of the highest frequency RF generator connected to that electrode. In some embodiments, each of these may have an impedance greater than about 100 Ohms, and in some embodiments greater than 500 Ohms. Sensors 280 may be voltage or current sensors or may combine both capabilities in a single package—for example, where a current sensor may include one or more segments of wire that may be covered by an electrostatic shield.

In some embodiments, the sensors 280 have electrical connections to Fourier analysis circuits in the signal analysis compartment 285 of the impedance matching network 215. The Fourier analysis circuits may output amplitude and phase of the different frequency components from each of the sensors 280 and compare them with other sensors 280 and/or with reference levels that are stored in memory. The analyses of the signals in some embodiments may include pattern recognition of amplitudes or phases or both, or artificial intelligence (AI) employing learning algorithms that may use neural networks or conventional digital algorithmic processing of the signals from the sensors 280.

Signal processing by the Fourier analysis circuits to find fundamental and harmonic component signals, both amplitudes and phases, may be done within less than about 10 micro-seconds and in preferred embodiments a 1 microsecond or less for each of the sensor signals. The isolated signal analysis compartment 285 of the impedance matching network 215 may incorporate at least one computation or logic processor having substantial computational capability with very high speed (<1 ns cycle time) circuits employing very high-speed logic ICs. In some embodiments, the processors in the signal analysis compartment 285 are programmable so that suppliers or users of the processing chambers 240 may provide or implement proprietary algorithms or analytical software upon the computing "platform" provided in the impedance matching network 215.

In some embodiments, the software programs for calculating parameters from signal amplitudes and phases, and further logic algorithms for determining the effect on processing uniformity of excursions from acceptable plasma conditions, may reside on a removable "plug-in" component that contains data storage and connects to the signal processing compartment. This software or logic calculates the extent of an excursion of the RF electromagnetic surface wave spectrum from that characteristic of nominal or proper operating conditions. Based on this, a processor associated with a controller may "decide" upon corrective action or termination of the process within about a millisecond, before the wafer is misprocessed. In some embodiments, a quantitative judgement as to the expected effect of the excursion on process uniformity or other properties may be done within about 500 micro-seconds of occurrence so that remedial action may start within a millisecond. Further, action may be taken such that there is minimal or no damage to the wafer or substrate being processed in the reaction chamber 240 at that time and thereby avoid loss of yield on that wafer or substrate.

The assessment and/or decision made in the signal analysis compartment 285 of the impedance matching network 215 may, in some embodiments be performed by the very fast computation or analytical system using algorithms residing on a plug-in storage and/or detachable data-processing device. In still other embodiments, the assessment decisions made in signal analysis compartment 285 may be performed using an analog or neural net type processor. Such decision may further use a decision algorithm that may reside on the detachable storage or processing device. The order for corrective action may then be promptly transmitted by high speed data line from compartment 275 of the impedance matching network 215 to the RF generator 205, which may temporarily interrupt, change, or terminate power to the plasma. This assures that factory management may promptly take or plan corrective action for that processing chamber 240 and RF plasma processing system 200.

Also shown in FIG. 2 is a set of sensors 290, which are configured on the outer surface of the base 295 of the showerhead 230, outside the vacuum region within the reaction chamber 240 in atmospheric conditions. In some embodiments, additional sensors 296 may be mounted on the pedestal base 297 and connected by high speed signal cables to the disclosed signal processing compartment 275 of the impedance matching network 220, as with sensors 290. The sensors 296, being located outside the vacuum environment of the reaction chamber 240, are substantially less expensive and less difficult to integrate into the information and processing network since no vacuum feed is required.

Sensors 255 may be disposed in some configurations to sense voltage and/or current on the surface of pedestal 235 and may be covered and protected from plasma by a dielectric cover 260. Sensors of this type and location are proximate to the wafer and/or substrate and therefore may have a sensitivity advantage in detecting certain modes of EM surface waves that are indicative of plasma asymmetry—which is an important type of plasma non-uniformity. These in-chamber sensors 255 may use communications lines that pass through the vacuum wall via a feed-through or a in some embodiments use wireless communication links operating at optical or at lower frequencies.

In general, phase and amplitude patterns of each frequency of EM surface wave over the surface of showerhead 230 and pedestal 235 may be determined by analysis of the signals from any of the groups of voltage, current, phase, or combination sensors 255, 280, 290, and 296, In general, EM surface waves at a given frequency produce voltage and current signals having phase relationships with signals of other frequencies. The magnitude of the voltage at each frequency and each point is the sum of voltages from all waves of that frequency originating from all points across the electrode surface. For an axisymmetric electrode surface where the power is fed symmetrically, and the plasma is axisymmetric, axisymmetric surface-wave modes will result from the superposition of waves from all parts of the electrode and other surfaces in the reaction chamber 240. In general, perfectly symmetrical plasma in a symmetrical chamber with a symmetrical electrode centered on the chamber's axis of symmetry would predominantly have symmetrical lines of equal phase and amplitude in the form of circles centered at the center of the pedestal 235.

Figure 3:
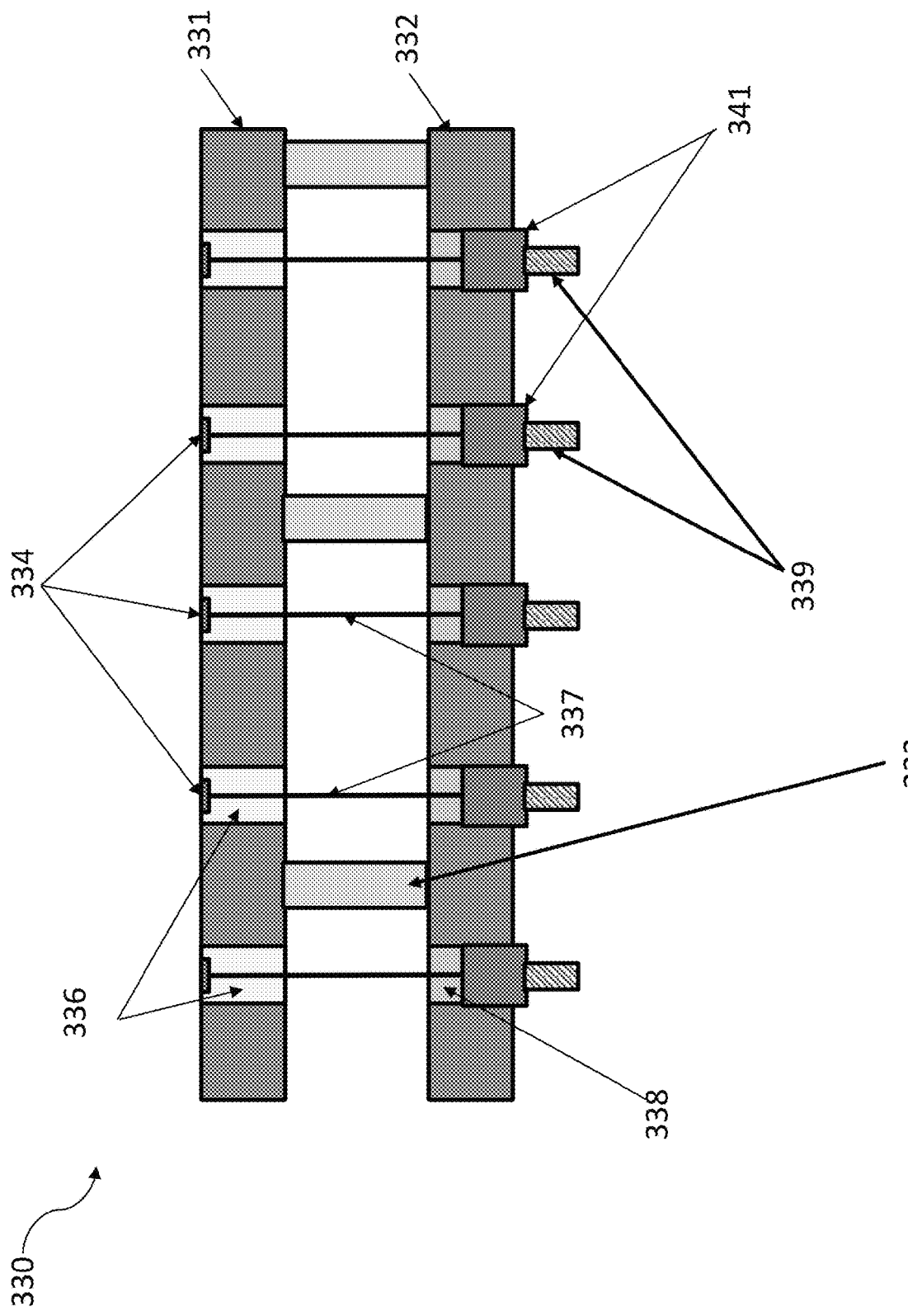
FIG. 3 is a cross-sectional view of a dual plate electrode assembly having sensors providing voltage signals through electrical connectors having low shunt capacitance to electrical ground, according to embodiments of the present disclosure.

Turning to FIG. 3, a cross-sectional view of a dual plate electrode assembly having wide bandwidth sensors providing voltage signals through electrical connectors having low shunt capacitance to the surrounding area of the electrode and to electrical ground, according to embodiments of the present disclosure is shown. In some embodiments an electrode, such as the showerhead 330, may include two conducting plates 331, 332 that are configured approximately parallel, with centers aligned, having generally the same shape as the substrate or wafer. A surface of the first plate 331 that faces away from the second plate 332 may be exposed to the vacuum environment and to the plasma. The first plate 331 is separated from the second plate 332 a distance that is the length of the dielectric standoff supports 333. The first plate 331 may have embedded sensors 334, whose pucks or pickups are of conducting material and whose surfaces are approximately co-planar with that surface of the first plate 331 that faces away from the second plate 332.

In some embodiments, the sensors 334 may be mounted into the first plate 331, surrounded by a dielectric 336 with a low dielectric constant, such as quartz or some other suitable material. In some embodiments, the dielectric 336 may have a dielectric constant less than 5 and in some embodiments the dielectric constant may be less than 2 for inorganic materials such as aerogels based on quartz. The sensors 334 may have high bandwidth extending from 100 kHz to at least 10 times the highest drive frequency connected to that chamber, that may be as much or more than 300 MHz and may be capable of sensing the surface voltage, the surface current, or both. The sensitivity of sensors 334 in some embodiments may vary by less than 30% over the range of frequencies of the harmonics of the principal fundamental RF frequency used in the reaction chamber. In some embodiments, at least one lead 337 from each sensor is connected to the inner conductor 338 of a vacuum electrical signal feedthrough 339, which has its base 341 mounted in the electrically grounded second plate 215. In some embodiments the leads from each sensor may be connected directly to a circuit board located in similar position to 332 having a ground plane and detector circuits, one for each sensor, to determine amplitude and phase for each frequency component.

The inner conductor 338 of the feedthrough 339 may have a small shunt capacitance to the base 341 of the feedthrough 339 mounted into the grounded second plate 332—e.g., less than 5 pico-farads (pf, and in some embodiments less than 2 pf, such that the total shunt capacitance from the sensor 334 plus the lead 337 plus the feedthrough 339 to ground should be less than 5 pf and in some embodiments less than 3 pf. In some embodiments the output from the base 341 mounted into the grounded second plate 332 may be connected to an attenuator (not shown). In some embodiments, the attenuator may include an electrical resistor having a resistance greater than about 100 Ohms. In parallel with the electrical resistor 404 there may be a shunt resistor to ground 405. The shunt resistor's resistance may be, e.g., 50 Ohms, or alternatively may be equal to the impedance of a cable that connects the attenuator to a communications network or to a controller for the plasma chamber. In cases where the detectors are located in FIG. 3 instead of the connectors as shown, the signal outputs from the detectors, which are the amplitudes and phases of voltage or current at each frequency for that sensor, may be transmitted to an analysis processor that may be in a compartment of the matching network.

Each sensor 334 may measure voltage or current amplitude of the combined electromagnetic surface wave modes, which have as components fundamental and harmonic frequencies for all RF generators providing power to the plasma. The fundamental and range of harmonic frequencies ranging from about 10 kHz to as much as about 500 MHz or more. In other embodiment, the sensors may measure voltage at fundamental and harmonic frequencies in range from about 100 kHz to about 1 Ghz.

Figure 4:
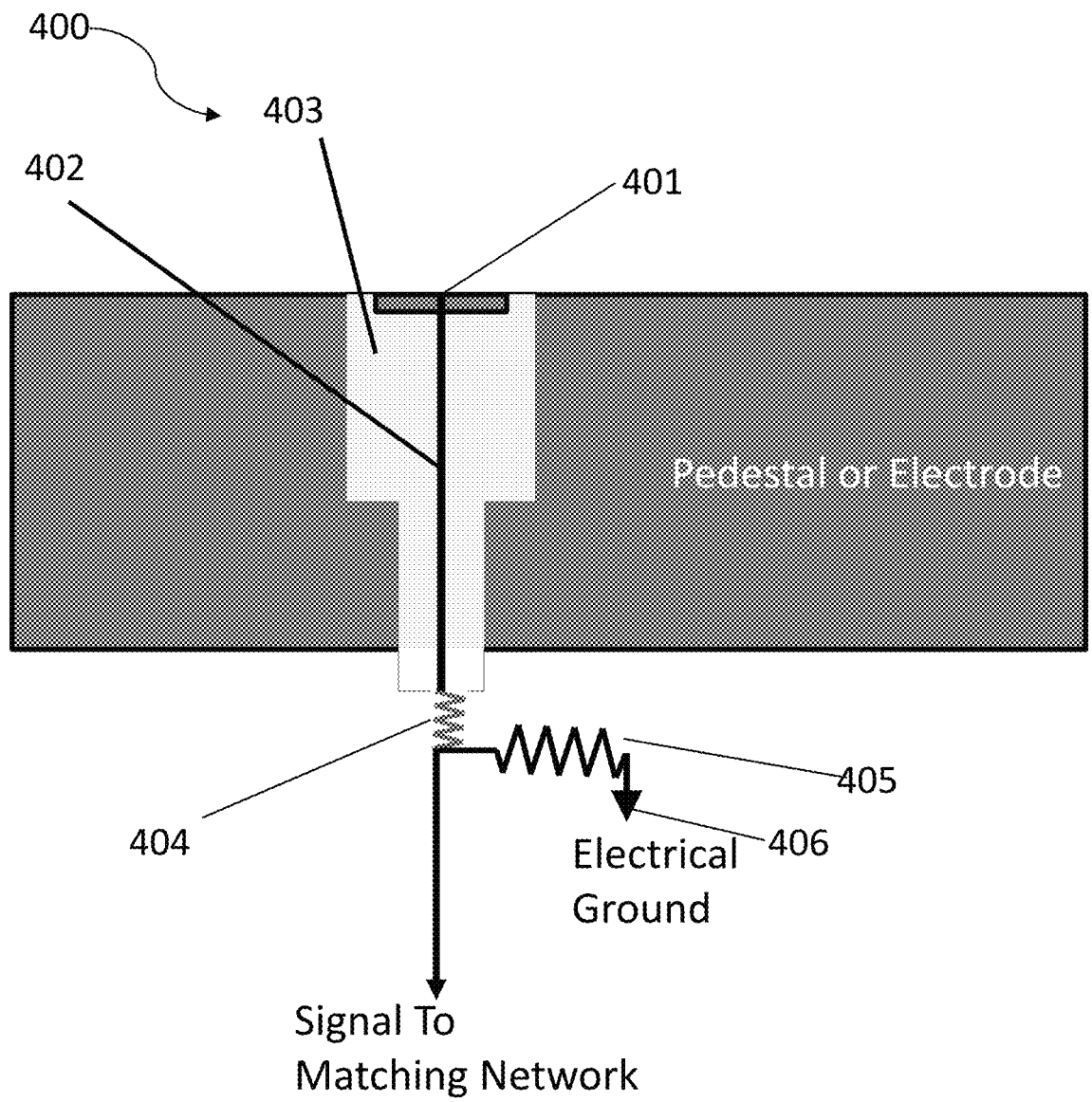
FIG. 4 is a cross-sectional view of a pedestal with an embedded high bandwidth voltage sensor, according to embodiments of the present disclosure.

FIG. 4 shows a cross-sectional view of a pedestal with an embedded broad-band voltage sensor, according to embodiments of the present disclosure. Voltage sensor 401 may be mounted into an electrode, such as pedestal 400. In some embodiments, the sensors 401 may be connected through a resistor to electrical ground 406. The tip or puck of sensor 401 may have a lead 402 surrounded by a dielectric 403 (which may optionally be air or vacuum). In some embodiments, the lead 402 from the sensor 401 may pass through an attenuator such as resistor(s) 404 with a shunt resistor 405 that may in some embodiments be about 50 Ohms and may also be connected to electrical ground 406. Such resistors 404 may be non-inductive and may have a resistance in the range between about 100 Ohms and about 100,000 Ohms. In some embodiments the resistance may be between about 500 Ohms and about 10,000 Ohms. Resistor 405 may also be non-inductive.

Further, the dielectric 403 should be generally non-magnetic and have a low loss tangent, in some embodiments less than about 0.01 or in other embodiments, less than about 0.001. The shunt capacitance between the tip of sensor 401 and lead 402 to the grounded electrode should be less than about 5 pf, or less than about 2 pf in some embodiments so that the reactance between the sensor 401 and the pedestal 400 electrode should be greater than about 100 Ohms at 300 MHz. The purpose of such low shunt capacitance is to reduce the loading of the surface wave by the sensor 401 so that it minimally absorbs the wave energy and permits the wave to propagate as it would in the absence of the sensor 401. Under such conditions, the surface potential that is detected will not be greatly different than it would have been on an electrode without such sensors 401.

Figure 5:
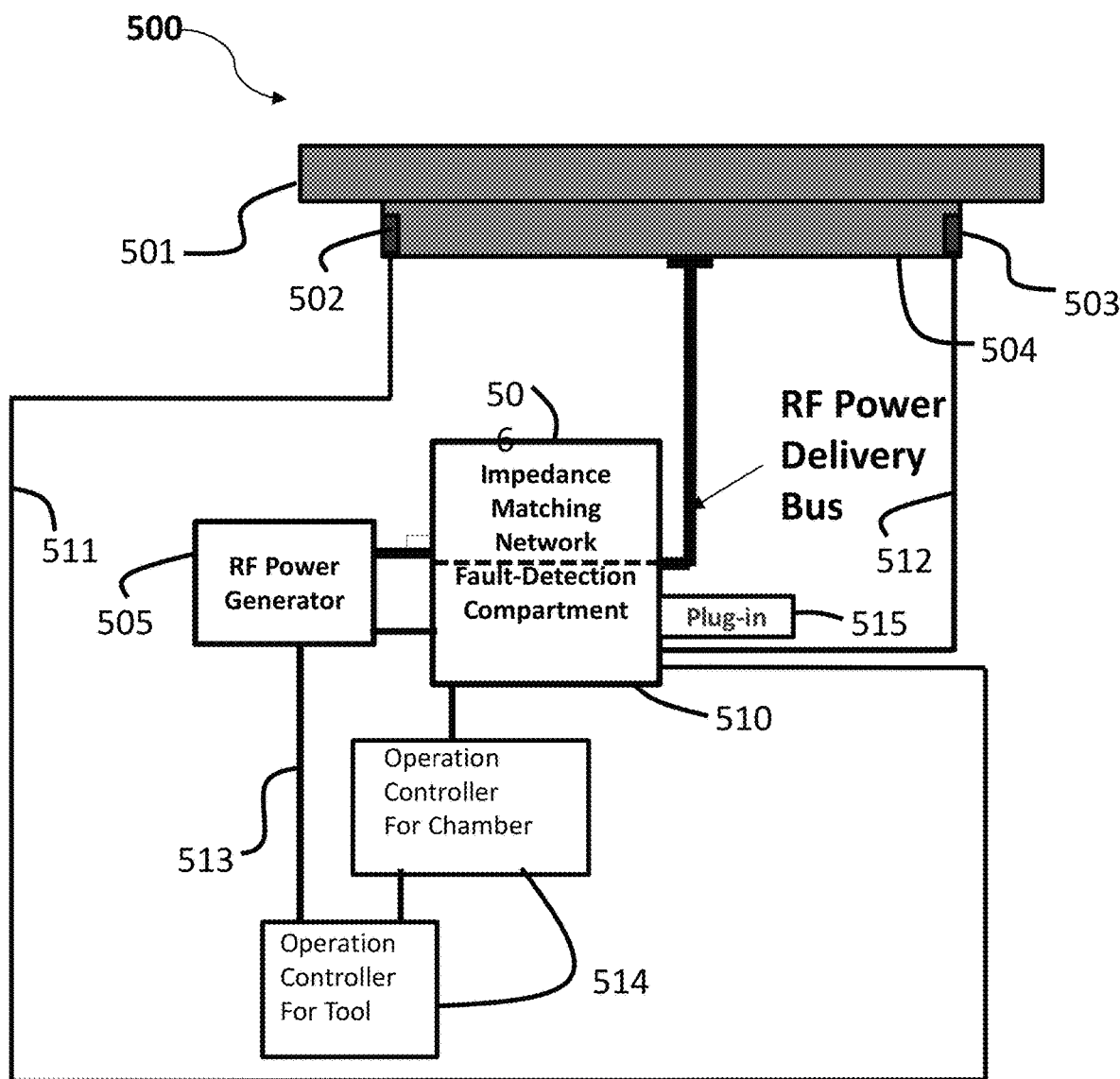
FIG. 5 is a schematic side view of a pedestal, according to embodiments of the present disclosure.

Turning to FIG. 5, a schematic side view of a pedestal with associated RF and control components, according to embodiments of the present disclosure is shown. Pedestal 501 power feed circuit includes RF power generator 405 and impedance matching network 506. High-speed signal lines, e.g., cables 511, 512, carry signals from sensors 502, 503 to a compartment that in some embodiments may be in or attached to the impedance matching network 506. High-speed lines 513 of a data network take information from the impedance matching network 506 to the controller(s) 514 of the reaction chamber, or generator, or tool or factory (not shown). Sensors 502, 503 are mounted on or near a base 504 of pedestal 501, which may be inside or outside the vacuum region of a reaction chamber.

In some embodiments, there may be a signal analysis, e.g., fault-detection, compartment 510 associated with the impedance matching network 506. The signal analysis compartment 510 may be electrically and/or RF isolated from certain components, such as vacuum capacitors and high voltage electronics, of impedance matching network 506. The signal analysis compartment 510 receives signals from sensors 502, 503 via cables 511, 12. Signal analysis compartment 510 then channels the signals from each sensor 502, 503 to an internal circuit that may be called a detector and may include electronic components such as transistors and passive components. In alternate embodiments where the amplitude and phase are found directly adjacent the sensor for each frequency component, the signals coming to the signal analysis compartment may be amplitude and phase for each frequency component rather than the raw signals.

Each detector (not shown) in the compartment 510 may perform RF spectrum analysis of signals from one sensor 502, 503 or from a group of sensors that may be analyzed in parallel. The analysis may include averaging the signals of a group of sensors, or of one or more sensors 502, 503 over time, for noise reduction. There may in some embodiments be an output from each detector of amplitude and phase for each frequency component of the signal obtained by each sensor 502, 503, e.g., fundamental and harmonics. The outputs from each detector may then be input to an analog-to-digital converter for each harmonic signal, yielding digitized values for both amplitude and phase of each harmonic measured.

These digital amplitude and phase values for each frequency component and each sensor may be input, with little to no delay, e.g., <10 microseconds, to high-speed digital processors in the signal analysis compartment associated with the disclosed impedance matching network. The digital processors may analyze both amplitude and phase information for fundamental and each harmonic from the sensors, determining the relative magnitude of the different surface-wave modes, including the axisymmetric mode and non axi-symmetric modes, for both fundamental and harmonics. There may be differing non-axisymmetric modes for each frequency component, one or more of which may be indicators of the plasma non-uniformity.

In some embodiments, such non-axisymmetric modes may be rapidly identified by algorithms that reside on the plug-in. A reference database correlating the magnitudes of non-axisymmetric modes with plasma non-uniformity percentages may also reside on this plug-in or detachable processor. The digital processors may also compute rates of change of the amplitudes of the wave modes and acceleration of amplitudes of one or more wave modes to determine the likelihood of a fault in the immediate future. One measure of the magnitude of a non-axisymmetric mode at a given frequency may be the difference between the phases of a given frequency surface wave at different sensor positions which have the same radial distance from the center of a circular electrode, symmetrically located in an axisymmetric chamber. Alternatively, a second indicator of non-axisymmetric modes may be differences between the amplitudes of a given frequency surface wave at different sensor positions which have the same radial distance from the center of a circular electrode that is symmetrically located in an axisymmetric chamber.

A matching network 506 having an isolated compartment 510 containing multi-channel detector systems (not shown) may simultaneously Fourier analyze, digitize and record voltage amplitude and phase of EM waves propagating at various locations on the pedestal 501. Because of inherent noise, each of the determined voltage amplitudes and phases may be averaged over brief time intervals, as needed, and may be averaged for groups of sensors 502, 503 to make a determination of relative magnitudes or average in time over a relatively large number of pulses.

A showerhead, pedestal, or other powered element such as an electrode, equipped with groups or arrays of sensors may be used as a test system to generate data to characterize and record the relationship between spectra and spatial patterns of EM wave modes and various non-uniformities of the plasma density during an RF process. These data may in some embodiments be analyzed offline by engineers to characterize and categorize plasma behaviors and put into a database that may be stored in a plug-in storage device that may be connected to matching network compartment or other controller or monitoring systems.

The relationship between amplitude and phase pattern characteristics of non-axisymmetric and axisymmetric EM modes, and process and plasma non-uniformities or deviations from proper conditions may be stored in the plug-in that connects to the disclosed signal analysis compartment of the matching network. In implementations where the RF plasma processing system may be used as a production tool, the non-uniformity of the plasma and process may thereby be rapidly detected as the operation of the chamber is being monitored. For example, the disclosed type of sensor shown in FIG. 4, configured as shown in FIG. 2, may be retrofitted to a RF plasma system as shown in FIG. 1.

To determine whether the process plasma may have experienced a plasma fault condition, the analysis processors in the signal analysis compartment associated with the impedance matching network may compute parameters based in part on the magnitudes of non-axisymmetric EM modes for each of a pre-specified set of harmonics of a drive frequency on some electrode or antenna. The processors in some embodiments may then compare these parameters to reference ranges in a database. Such reference database may reside on a plug-in that is connected to the signal analysis compartment that may be a compartment in or associated with the impedance matching network.

The database may store parameters characterizing various plasma conditions to aid in determining whether and how severe a plasma excursion from an acceptable "process window" is. In some embodiments, the analysis may include a comparison of phases of each harmonic from every sensor or group thereof at a given distance from the center of the electrode. The variance of such phases for a sensor or group of sensors about any azimuth may be a measure of the asymmetry of the generation and/or propagation of that harmonic mode, and therefore may be a measure of plasma asymmetry and non-uniformity. In some embodiments the analysis may include calculation of differences of amplitude among sensors or groups of sensors at a given distance from the symmetry axis. The variance of such amplitudes for a sensor or group of adjacent sensors in a range of azimuth may also be a measure of the asymmetry of the generation and/or propagation of that harmonic mode, and therefore may be a measure of plasma asymmetry and non-uniformity.

A quantitative measure of the asymmetry for each of a set of harmonics, a parameter, may then be stored in the plug-in unit, and may be transmitted through the data network to the chamber and the tool controllers. Further, the trend and acceleration in the parameters may be computed and compared with reference values and criteria in the database as part of the process of determining whether a fault condition occurs. In some embodiments, when such fault condition occurs, algorithms and criteria that may be stored on the plug-in, may execute in the processors resident in the compartment to determine a course of remedial or preventive action. Such action then may be transmitted rapidly to the RF generator and/or the chamber and/or tool controllers.

In some embodiments, all such databases of parameters, algorithms, criteria, and specifications for comparing the parameters, rates of change of parameters, and acceleration of parameters may reside on a data storage device or detachable processor, that may be connected to a port that may be an input/output port of the signal analysis compartment. The analysis of the surface wave modes based on signals from the sensors, and parameters derived therefrom, performed so rapidly by the processors that any fault declaration and remedial action orders may be transmitted to the RF generator, and reported to the controller for the chamber or system via a network within five milliseconds or less of the occurrence. In some embodiments, a fault condition and specified remedial action orders may be transmitted to the generator within one millisecond.

In some embodiments, many types of plasma excursions from desired plasma uniformity may be detected quickly enough that the tool or chamber controller may take measures to correct the plasma fault condition before the wafer or substrate is misprocessed. In some circumstances, the specified remedial action may be that RF power format, e.g., continuous-wave (CW) or pulsed, is altered briefly, or power turned off completely for a brief period or frequency change, or processing of the current wafer may be halted and the wafer saved for later processing or discarded, or the reaction chamber may be shut down for maintenance.

In certain embodiments, upon detection of a plasma fault condition, the disclosed signal analysis compartment associated with the matching network may order appropriate corrective actions to be executed by the RF generator and/or in some embodiments by the matching network. For example, the RF process generator may initiate a termination process to end the processing of wafers in response to the signals measured by sensors on the showerhead and/or pedestal. Alternatively, power may be interrupted, e.g., the institution of pulsed power, by the RF plasma processing deposition system to stop or pulse the plasma so that secondary plasmas are stopped or greatly reduced. In some cases, after a very brief interruption, the specified remedial action may provide that processing can then continue. In certain implementations, the remedial action may be determined through, for example, machine learning and/or programmed remediation programs based on yield data or other wafer diagnostics.

Figure 6:
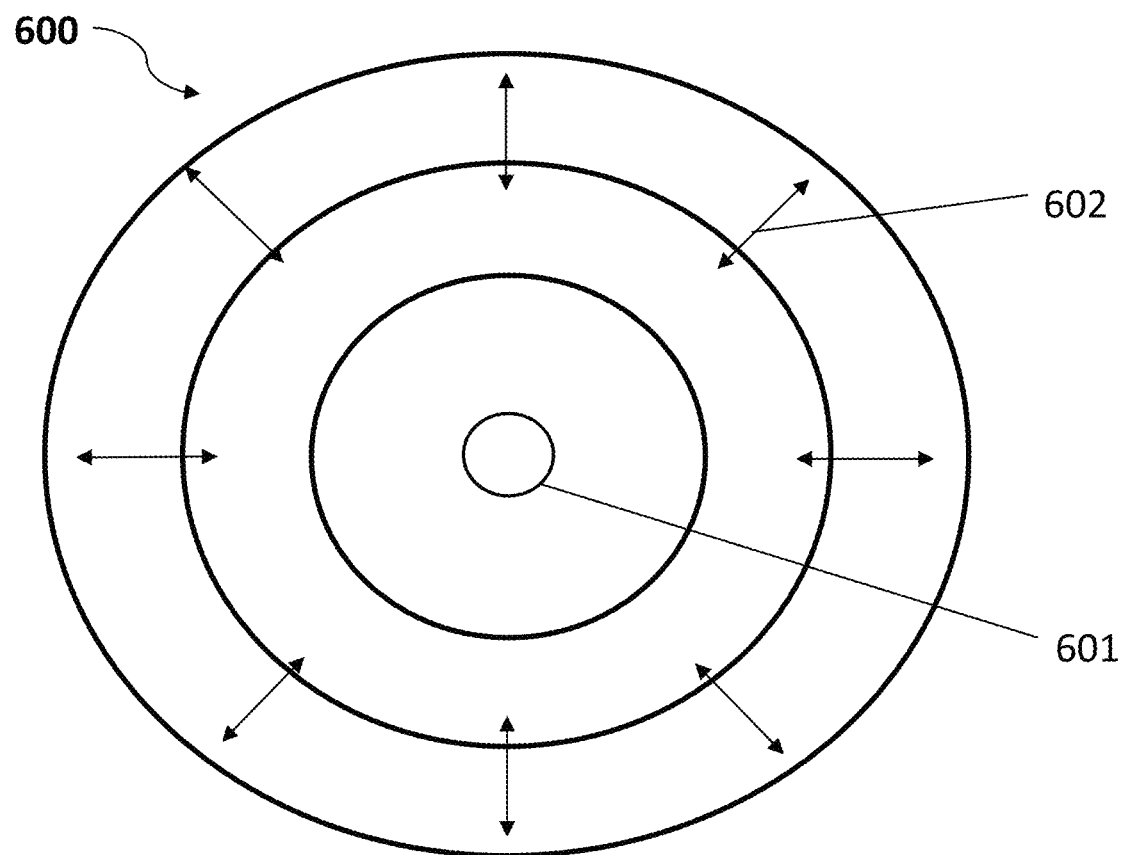
FIG. 6 is a top view of the propagation of axisymmetric surface waves across a pedestal where the plasma in the reaction chamber is axisymmetric, according to embodiments of the present disclosure.

Turning to FIG. 6, a top view of the propagation of axisymmetric surface waves across a pedestal where the plasma in the reaction chamber is axisymmetric, according to embodiments of the present disclosure is shown. In FIG. 6, circles 601 are the curves of constant phase and amplitude for fundamental and harmonic frequency components of axisymmetric surface-wave modes. The circles are concentric with the electrodes. These modes are highly dominant when in the chamber, electrode and plasma are all axisymmetric and coaxial. The propagation vectors 602 for the surface waves at any frequency will be radial. The waves will propagate both toward the center and away from the center, and as they propagate, such waves will inject power into the plasma.

Figure 7:
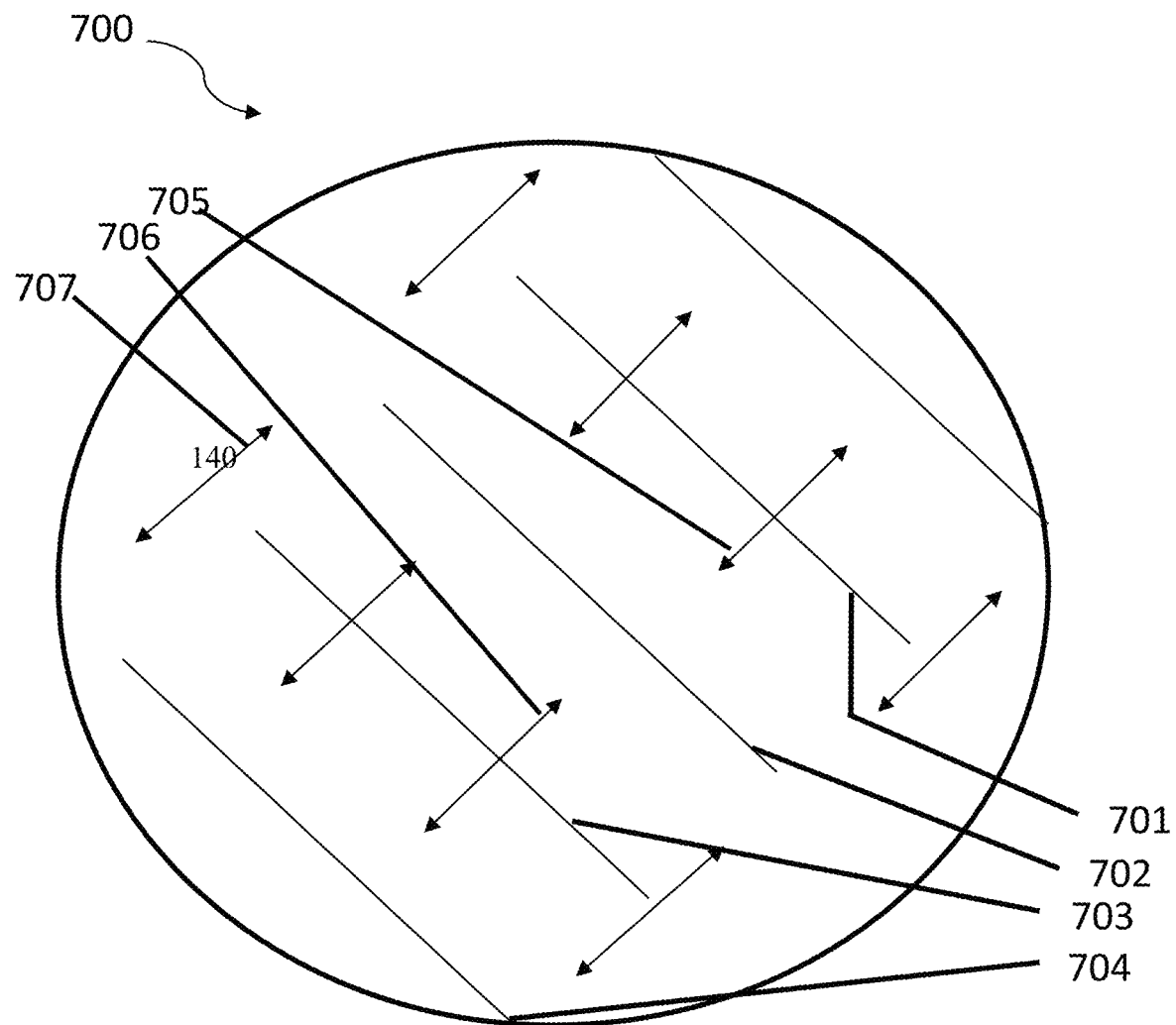
FIG. 7 is a top view of transverse electromagnetic surface wave propagation across an electrode, according to embodiments of the present disclosure.

Turning to FIG. 7, a top view of transverse electromagnetic surface wave propagation across an electrode, according to embodiments of the present disclosure is shown. In FIG. 7, the lines 701-704 of constant phase and equal amplitude for a particular single non-axisymmetric mode are approximately straight and parallel, whether at the fundamental frequency or a harmonic thereof. Such surface waves may be detected by sensors disposed on a pedestal or showerhead of the RF plasma deposition system. This mode may be called "transverse" which means that the direction of propagation, as seen in propagation vectors 705-707, is across the electrode surface from one side to the other or from a central plane to both left and right sides. There may be other non-axisymmetric modes where the lines of constant phase may be curves that have a center of curvature displaced from the center of the electrode. The detector readings for each frequency can be decomposed into a sum of axisymmetric modes and (often a small number of) non-axisymmetric modes that reflect the major non-uniformities of the plasma. Typically, the decomposition may permit identification of a transverse mode component and/orone main "off-center" or displaced radial mode, either of which is characteristic of a configuration of plasma non-uniformity. The correlations of the configuration of plasma non-uniformity with the particular non-axisymmetric modes is done in advance of production processing as part of building the database, which may reside on the plug-in unit or elsewhere.

Figure 8:
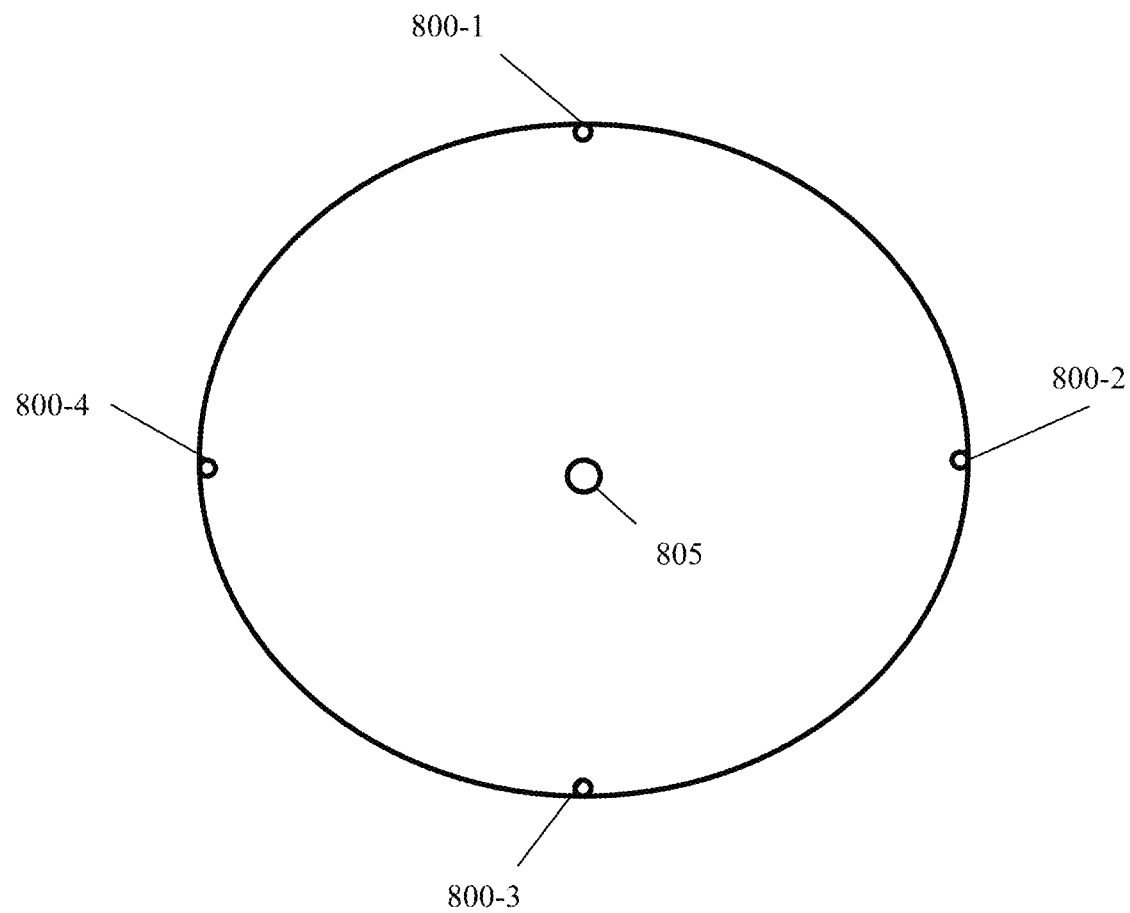
FIG. 8 is a top cross-sectional view of azimuthally (about the chamber symmetry axis) mounted sensors on a reaction chamber, according to embodiments of the present disclosure.

Turning to FIG. 8, a top view of one exemplary azimuthal sensor disposition for a reaction chamber, according to embodiments of the present disclosure is shown. In this embodiment, a plurality of sensors 800 may be disposed azimuthally around one or more components of a reaction chamber and/or on the reaction chamber itself. As briefly discussed above, the plurality of sensors 800, which in this embodiment may be four, may be positioned upon certain chamber components, such as a showerhead and/or a pedestal, at different angles about a chamber symmetry axis 805 for measuring the surface voltage or current associated with surface waves. In this case at 90-degree intervals, but in some embodiments may be at irregular intervals of azimuth.

Sensors 800 may include passive sensors 800 that pick up changing electric potentials or magnetic fields. Sensors 800 may be disposed at differing azimuths for detecting EM waves having different types of propagation modes relative to chamber symmetry axis 805. Sensors 800 may be disposed at equidistant locations around chamber symmetry axis 805 and/or components within a reaction chamber, or the reaction chamber itself. Similarly, sensors 800 may be disposed diametrically opposite one another, such that the spacing between sensors 800 and the symmetry axis may be approximately the same. For example, the distance between sensor 800-1 and 800-2 is approximately the same as that between 800-3 and 800-4. Similarly, each sensors 800 is located the same distance from chamber symmetry axis 805. Examples of sensor 800 spacing and location are discussed in greater detail below.

As illustrated, the sensors 800 are disposed at diametrically opposite locations. For example, sensor 800-1 is diametrically opposed to sensor 800-3, while sensor 800-2 is diametrically opposed to sensor 800-4. The sensors 800 may for non-axisymmetric plasma thus find differences in wave forms on different sides of the reaction chamber and/or components thereof, and when differences in the wave forms occur, provide notification, as explained above, so that remedial or proactive actions may be taken. For example, if sensor 800-1 and sensor 800-4 sense and report a difference in waveform from their diametrically opposed locations, such differences may provide an indication that the harmonics are out of phase or have differing amplitudes, which may thereby indicate there is plasma nonuniformity and asymmetry. Such differences in waveform occur when there are differences between diametrically opposite detectors in the relative phase or amplitude of one or more harmonics in signals picked up by the opposite sensors.

In certain embodiments, four sensors 800 may be used, as illustrated in FIG. 8. However, in other embodiments differing numbers of sensors 800, such as six, eight, twelve, fourteen, sixteen, eighteen, twenty, or more sensors 800 may be used. In some embodiments the azimuth angles between sensors may not be equal, nonetheless, the same characteristics of non-azimuthally symmetric plasma modes may be observed by sensors. In certain implementations, it may be beneficial to have between six and twelve sensors 800. The greater the number of sensors 800, the more data may be collected, thereby providing enhanced ability to discriminate against noise and sensitivity for recognition of nonuniformity. However, by increasing the number of sensors 800, data processing may be slowed, thereby resulting in remediation and preventive actions that occur more slowly. Those of ordinary skill in the art will appreciate that balancing the number of sensors 800 with a desired level of granularity of data may thereby allow the RF plasma process to be optimized. As such, as computing power increases, and the speed with which data may be processed increases, it may be beneficial to increase the number of sensors 800. In certain embodiments, specific sensors 800 may be selectively turned off and on, thereby allowing controllers to access certain desired data. For example, in a system having eight sensors, four of the sensors may be selected and turned off, thereby decreasing the amount of generated data. In other embodiments, additional sensors may be added or removed from operation, thereby changing the amount of data that is generated.

Sensors 800 may also include various types of sensors, both round and other geometries. In certain embodiments, sensors 800 may be circular having an area between about 0.1 square centimeter and about 10 square centimeters. Sensors 800 may further include a surface insulator layer or coating to protect sensors 800 from plasma or reactive species in a reaction chamber and may also include other optional coatings and layers such as faraday shields for current sensors, aluminum coatings, and the like.

Figure 9:
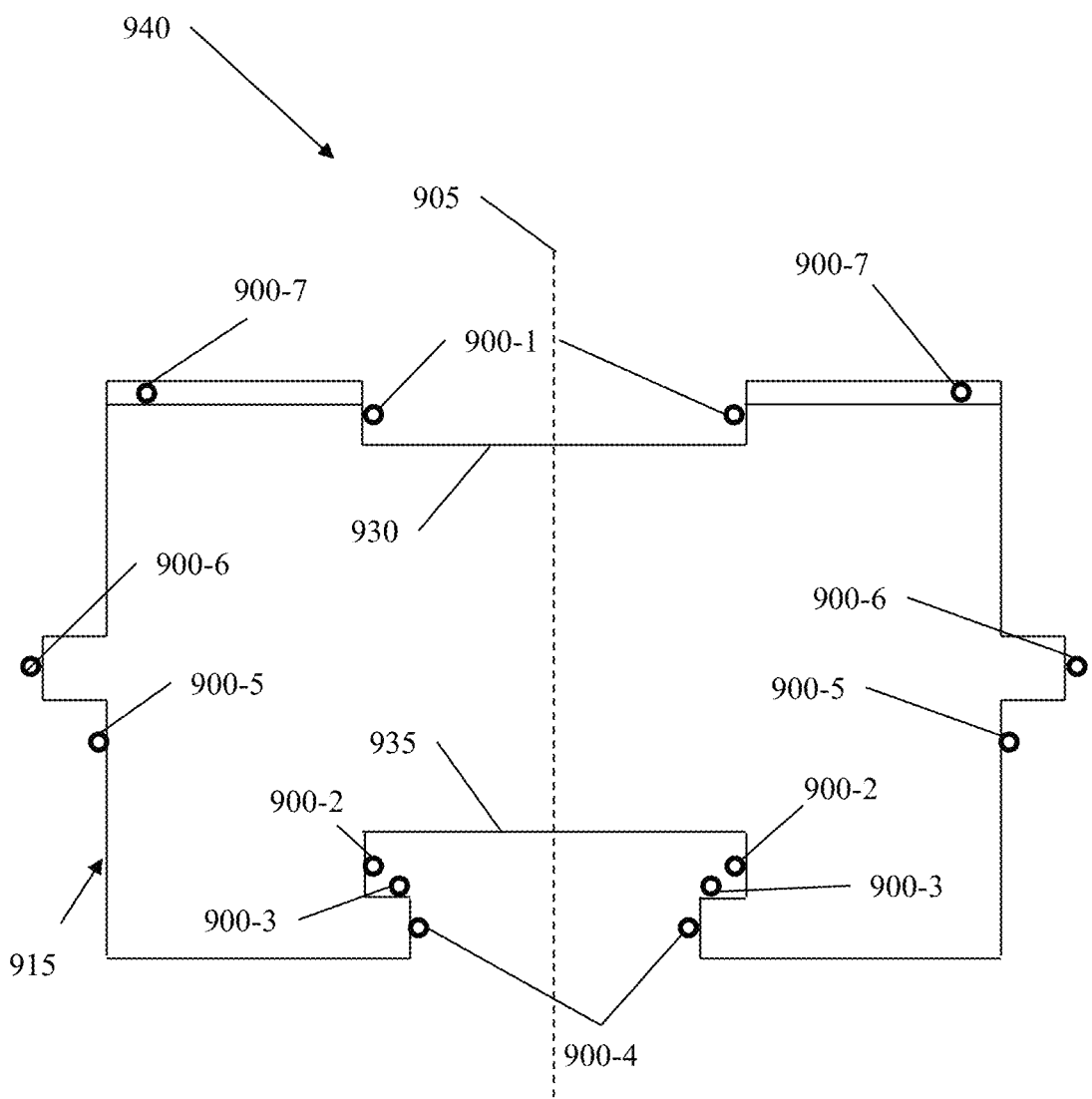
FIG. 9 is a side cross-sectional view of azimuthally mounted sensors on electrodes, electrode bases, a top dielectric plate, viewports and dielectric wall of a reaction chamber, according to embodiments of the present disclosure.

Turning to FIG. 9, a side cross-sectional view of azimuthally mounted sensors on a reaction chamber, according to embodiments of the present disclosure is shown. In this embodiment, reaction chamber 940 has a symmetry axis 905 that runs longitudinally from the center of showerhead 930 through pedestal 935. In other embodiments, symmetry axis 05 may run longitudinally from the center of another electrode, such as an antenna. A plurality of sensors 900 may be azimuthally disposed at various locations around and inside reaction chamber 940, as well as around or associated with specific components, such as showerhead 930 and/or pedestal 935. As FIG. 9 is a cross-section, only two sensors 900 for each location are illustrated, however, more sensors 900 may be used during implementation of the RF plasma monitoring process, as discussed in detail with respect to FIG. 8.

In certain embodiments, sensors 900-1 may be disposed around the edge or periphery of showerhead 930. In such an implementation, sensors 900-1 may be disposed at least partially or completely embedded within showerhead 900-1 and the outer surface of sensors 900-1 may be coated with an insulating layer, thereby protecting sensors 900-1 from the environment within reaction chamber 940. In such an embodiment, two or more sensors 900-1 may be azimuthally disposed around the edge of showerhead 930, and preferably four or more sensors thereby allowing for detection of nonuniformity and asymmetry in RF plasma processing.

In other embodiments, sensors 900-2 may be disposed along the edge of pedestal 935 within the vacuum of reaction chamber 940. As explained above with respect to sensors 900-1, sensors 900-2 may be partially or completely embedded in pedestal 935 and may or may not include an insulating layer disposed on an outer surface thereof. Further, in some embodiments they may have a dielectric protective part covering them. In additional to sensors 900-2 disposed around the pedestal 935 inside the vacuum, other sensors 900-3 and 900-4 may be disposed outside of the vacuum of reaction chamber 940 and around pedestal 935. Such sensors 900-3 and 900-4 may be disposed on a metal surface along pedestal 935 and/or a base portion thereof. Sensors 900 may also be disposed on other support structures of or associated with pedestal 935.

In still other embodiments, sensors 900-5 may be disposed and/or otherwise built into the sidewall of reaction chamber 940. In such embodiments, where the wall is dielectric, sensors 900-5 may be disposed outside reaction chamber 940 on an outside chamber wall 915 or may be built into the sidewall so that sensors 900-5 are within the vacuum of reaction chamber 940. For metal walls, sensors should have their pickups exposed in the inner surface of the wall so that EM fields on the inside of the chamber may be sensed. Other sensors 900-6 may be disposed into view ports 920, which are located along the outside chamber wall 915. In such embodiments, sensors 900-6 in viewports may be located outside the vacuum of reaction chamber 940 or located within reaction chamber 940.

In yet other embodiments, sensors 900-7 may be disposed in dielectric located around, for example showerhead 930, while in other implementations, sensors 900-7 may be disposed in dielectric located around pedestal 935. While specific locations for sensors 900 are discussed herein, sensors 900 may be located at various other locations in and around reaction chamber 940. For example, sensors 900 may be disposed inside or outside a dielectric wall near an antenna or other components. Sensors 900 may further be located at various other locations inside a metal wall of reaction chamber 940.

In certain embodiments, combinations of sensors 900-1-900-7 may be used in order to more accurately monitor RF plasma processing. For example, sensors 900-1 around the edge of showerhead 930 may be combined with sensors 900-2 around the edge of pedestal 935. Similarly, combinations of sensors 900-5 outside reaction chamber 940 may be combined with sensors 900-1/900-2 located within reaction chamber 940. In still other embodiments, combinations three, four, five, six, seven, or more variations of sensor 900 location may be used to further optimize monitoring of RF plasma processing.

Figure 10:
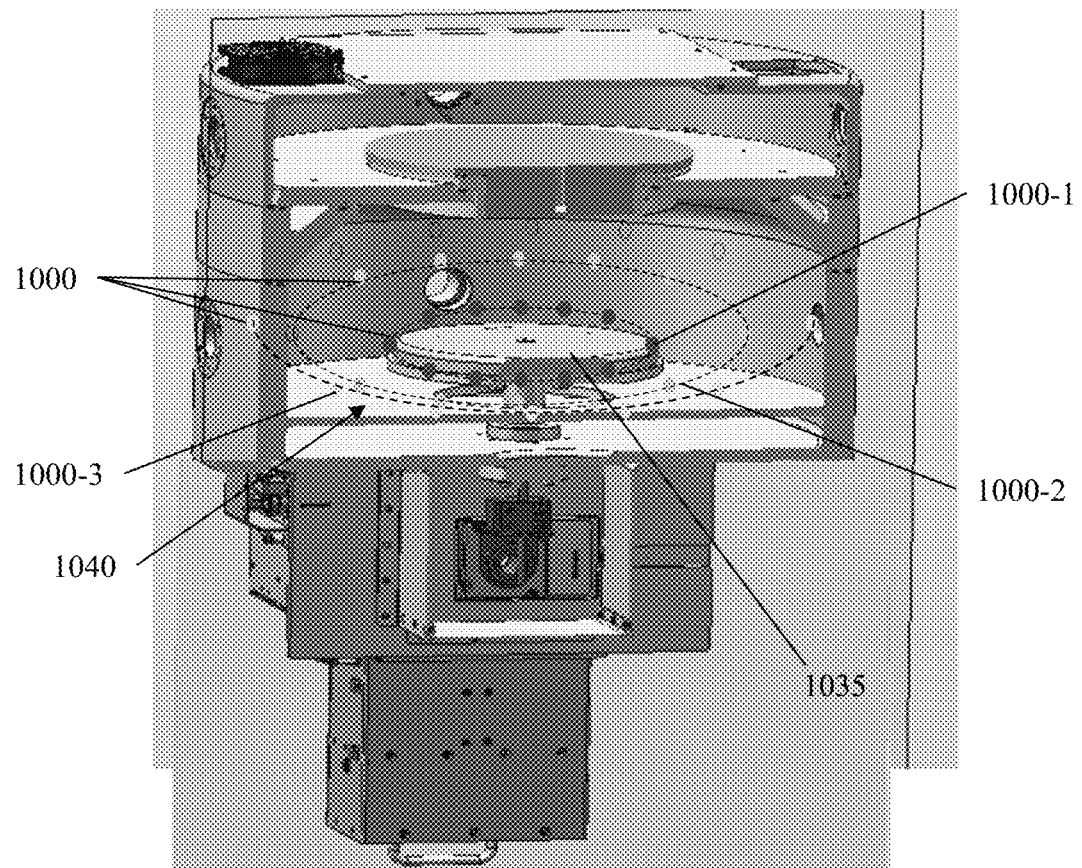
FIG. 10 is a side cross-section view of a capacitive coupled plasma reactor chamber with some sensor array locations according to embodiments of the present disclosure.

Turning to FIG. 10, a side cross-section of a model reactor chamber according to embodiments of the present disclosure is shown. In this embodiment exemplary positions are shown for a plurality of azimuthally disposed sensors 1000, located around a bottom electrode which in this example is pedestal 1035. Similar to the sensors 1000 discussed above with respect to FIG. 9, FIG. 10 illustrates sensors 1000 that are disposed in various locations. Sensors 1000-1 are disposed around an outer edge of pedestal 1035. Sensor azimuthal positions indicated as 1000-2 are disposed around the inside of reaction chamber 1040, while sensor azimuth positions 1000-3 are disposed around the outer periphery of reaction chamber 1040 adjacent viewports.

In this embodiment, twelve sensors 1000 are illustrated at each location, however, in other implementations, other numbers of sensors 1000, both fewer and greater, may be used. Also, in addition to the sensor 1000 locations expressly illustrated, other sensor 1000 locations may also be used to further enhance RF plasma processing.

Figure 11:
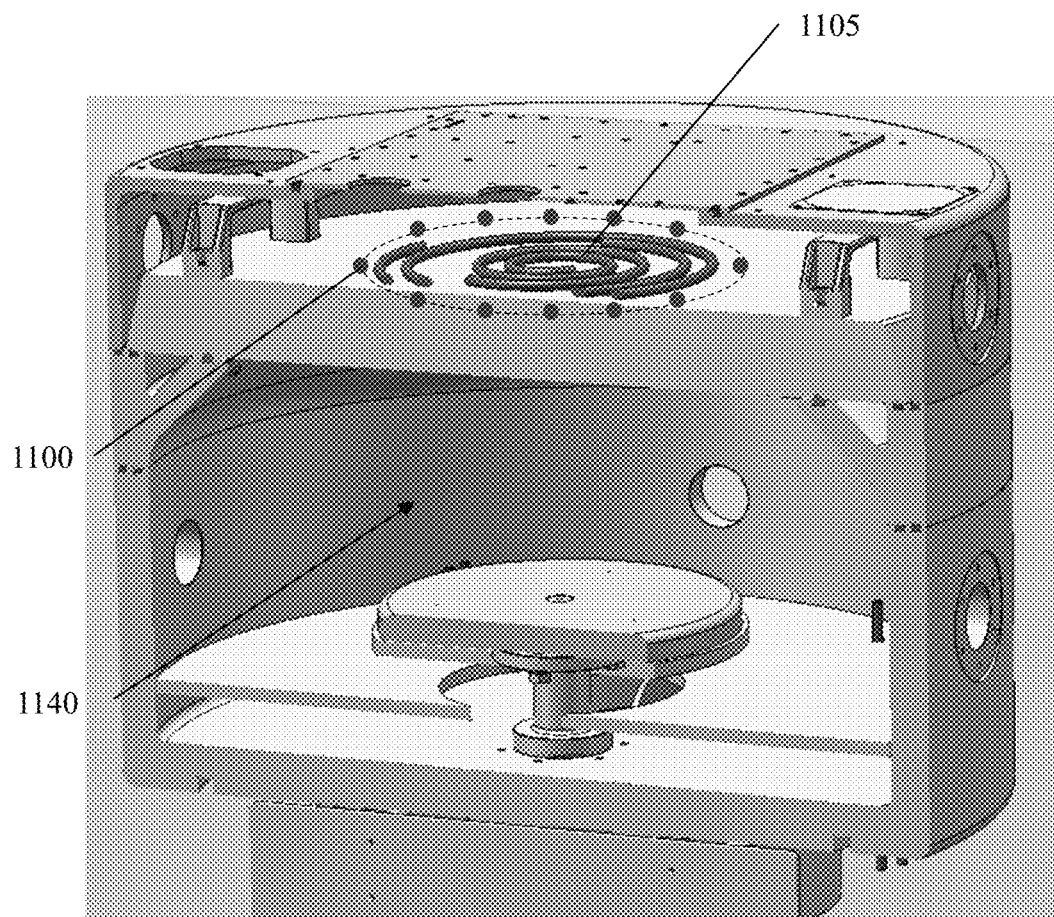
FIG. 11 is a side cross-section view of a model inductive plasma reactor chamber according to embodiments of the present disclosure.

Turning to FIG. 11, a side schematic cross-section of a reaction chamber according to embodiments of the present disclosure is shown. In this embodiment, sensors 1100 are illustrated disposed around the antenna of an inductively coupled plasma source 1105. As such, sensors 1100 may sense RF currents or voltages from a plasma source that is located within reaction chamber 1140.

Figure 12:
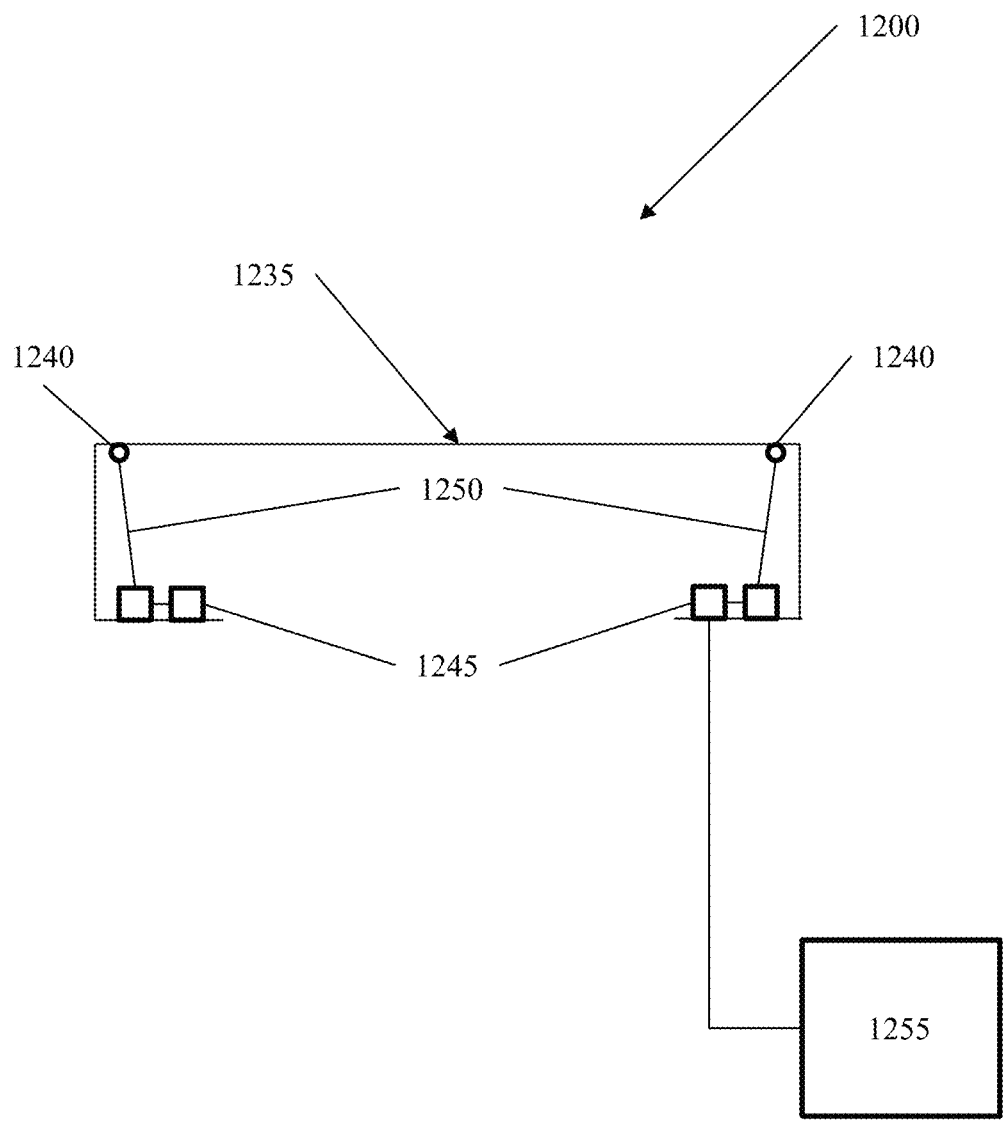
FIG. 12 is a schematic side view partial cross-section of a RF plasma processing system with some possible sensor locations according to embodiments of the present disclosure.

Turning to FIG. 12, a partial cross-section of a RF plasma processing system, according to embodiments of the present disclosure is shown. In this embodiment, RF plasma processing system 1200 includes a pedestal 1235. Pedestal 1235 includes sensors 1240 that are disposed along an upper outer edge of pedestal 1235. As described above, sensors 1240 may be disposed on an upper, outer edge, embedded within pedestal 1235, or may alternately be disposed around an outer edge either inside or outside the vacuum of a reaction chamber.

RF plasma processing system 1200 also includes circuitry 1245 that is connected to sensors 1240 through communication lines 1250. As sensors 1240 receive sensed data from RF plasma processing system 1200, the data may be sent to circuitry 1245 for processing. Because the circuitry 1245 is relatively close to sensors 1240, the time taken to transfer the sensed data therebetween may be decreased. As such, initial calculations as to the electrical properties sensed by sensors 1240 may be performed more quickly, then transferred to other components 1255 of RF plasma processing system 1200. The other components 1255 may include, for example, an RF generator, an impedance matching network, a fault detection compartment, an operation controller for the reaction chamber, an operational controller for the tool, a plug-in device, a signal analysis compartment, or other component(s) connected to RF plasma processing system 1200.

Components of the RF plasma processing system 1200, either the other components 1255 or still other components not shown may then adjust aspects of RF plasma processing system 1200 to correct for a fault that is detected by sensors 1240 and processed at least partially within circuitry 1245. Circuitry 1245 may be located within pedestal 1235 outside of the vacuum of the reaction chamber (not shown) in an isolated structure to protect circuitry 1245 from the conditions within the reaction chamber. In other embodiments, circuitry 1245 may be located in a base of pedestal 1235, or in other areas proximate pedestal 1235.

As FIG. 12 illustrates a cross-section of a components of an RF plasma processing system 1200, one of ordinary skill in the art having the benefit of this disclosure will appreciate that circuitry 1245 may be disposed at approximately the same radius at different azimuths around pedestal 1235. As such, independent circuitry 1245 may be available for each sensor 1240 or sensors 1240 and may be connected to centralized circuitry 1245 that is located in one or more select locations around and/or within pedestal 1235.

Figure 13:
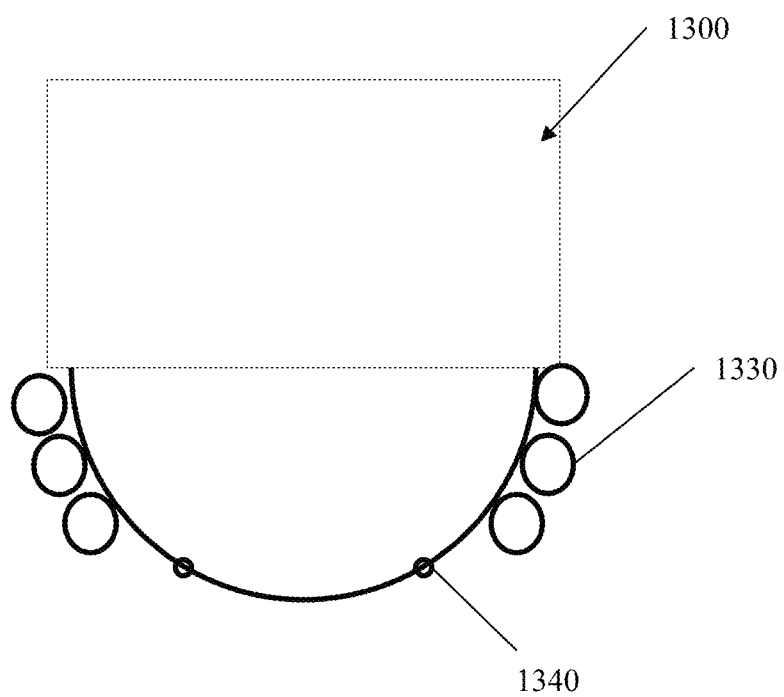
FIG. 13 is a schematic partial cross-section including the dielectric wall of a RF plasma processing system where the sensors are mounted on the dielectric surface proximate the inductive coupling antenna according to embodiments of the present disclosure.

Turning to FIG. 13, a partial cross-section of an inductively coupled RF plasma processing system 1300, according to embodiments of the present disclosure is shown. Sensors 1340 are shown configured proximate the induction antenna 1330 and may be mounted outside or inside a dielectric wall (not shown) that is adjacent the antenna.

Figure 14:
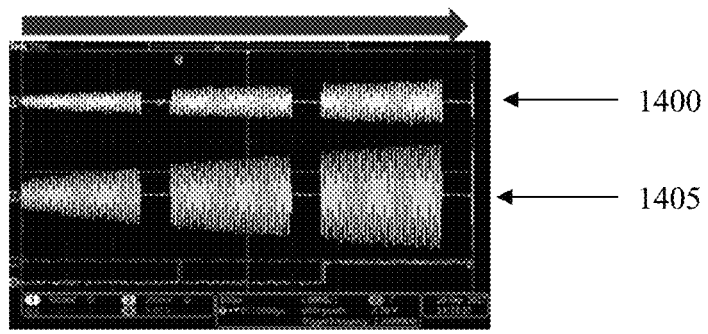
FIGS. 14, 15, and 16 are process phase diagrams for a RF plasma processing system matching network according to embodiments of the present disclosure.
Figure 15:
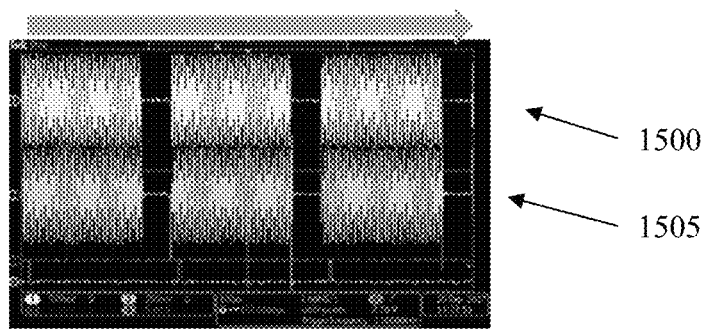
Figure 16:
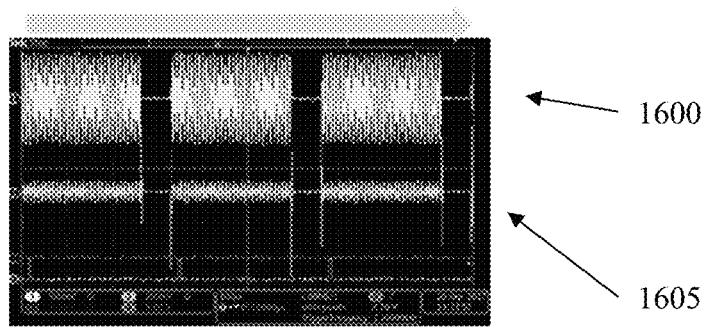

Turning to FIGS. 14, 15, and 16, show several process phases in an RF plasma processing system matching network, according to embodiments of the present disclosure are shown. In FIG. 14, phase one of a process is shown, wherein the amplitude of the radio frequency increases with time as the DC power, feeding the RF section, is brought to full power when it is turned into an on position, thereby providing a higher voltage. Phase one may last, for example, approximately 1 millisecond, depending on the design features provided by the manufacturer. As illustrated, the forward voltage 1400 is increasing with each pulse, and similarly, the reflected voltage 1405 is also increasing with each pulse.

In FIG. 15, phase two of a process is shown, wherein the amplitude of the radio frequency voltage is constant, but the match is not turned. Accordingly, the amplitude of the forward voltage 1500 is constant, as is the amplitude of the reflected voltage 1505. In FIG. 16, phase three of a process is shown, in which the match is tuned. In phase three, the amplitude of the forward voltage 1600 is constant. The amplitude of the reflected voltage 1605 is also constant, however, the amplitude of the reflected voltage 1605 is also lower. A fourth phase, not illustrated, may also occur in some embodiments, in which a process parameter has changed, such as a change to a capacitor, and an end point is reached. During the fourth phase, an impedance may have changed, which may result in a change to the voltage.

Figure 17:
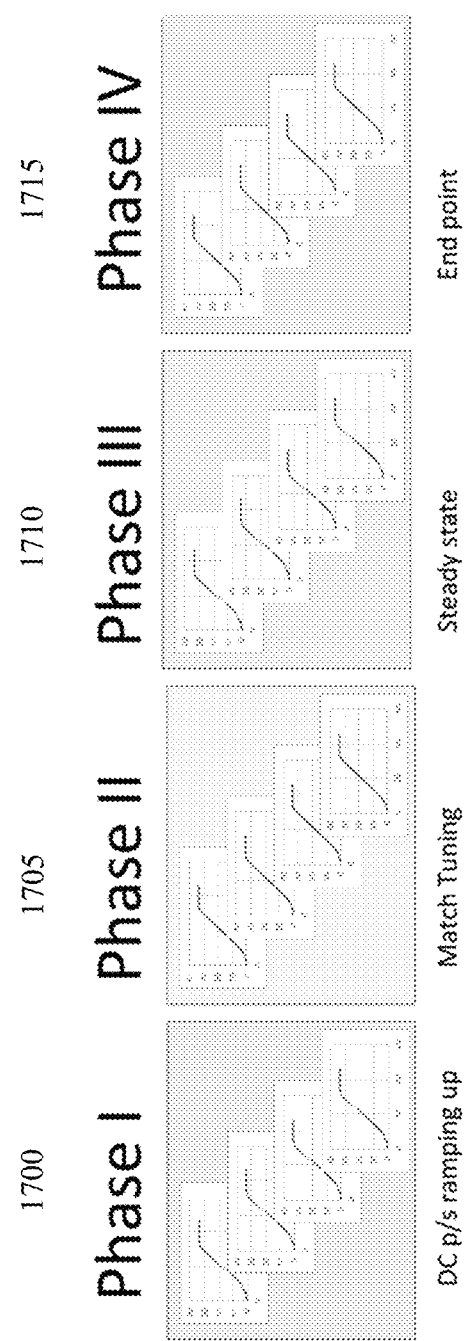
FIG. 17 is a schematic representation of the phases of a radio frequency processing system matching network according to embodiments of the present disclosure.

Turning to FIG. 17, a schematic representation of the phases of a radio frequency processing system matching network, according to embodiments of the present disclosure is shown. As discussed in greater detail above, a process may include four phases. During phase one 1700, the direct current is ramping up. During phase two 1705, the matching network begins to become tuned, but may not be fully tuned. In phase three 1710 a steady state may occur, in which the reflected voltage is relatively low. In the fourth phase 1715, an end point may be reached. This process may occur numerous times for a particular wafer.

Aspects of the present disclosure may allow for statistics to be derived for individual wafers based on dynamic changes in the process that are represented above with respect to the various phases of operation. Accordingly, statistics may be performed for one or more of the phases, and may include signals associated with a particular pulse. For example, statistics may be prepared that allows for voltage of a radio frequency, current of a radio frequency, and/or phases in terms of degrees between the voltage of the radio frequency and the current of the radio frequency. The process may be completed for numerous wafers, and the statistics compiled, thereby allowing for trends to be monitored. The trends may be used to determine when various alerts and/or intervention commands may be issued. Aspects of determining the statistics and generating alerts and intervention commands are discussed in detail below.

Figure 18:
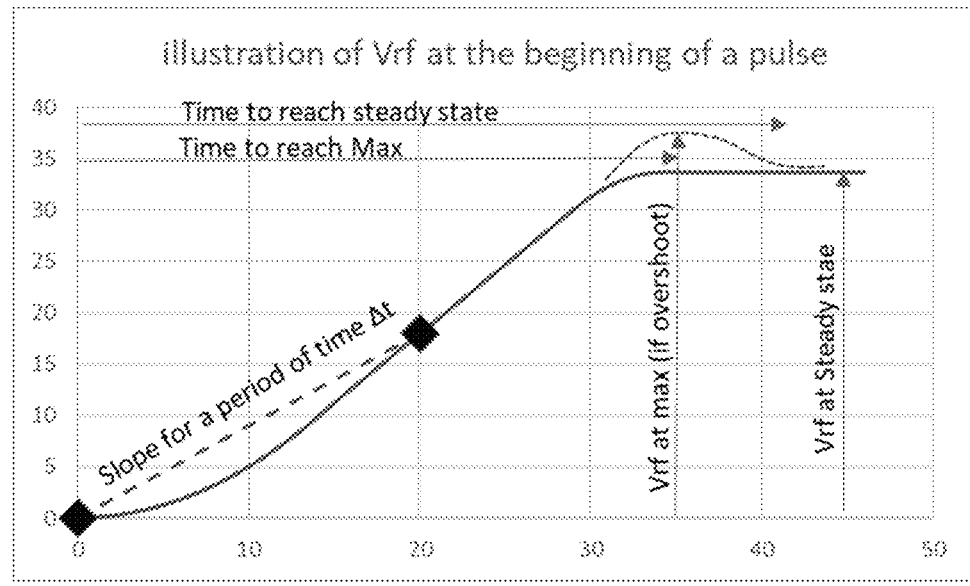
FIG. 18 is a graphical illustration of voltage at a beginning of a radio frequency pulse in a radio frequency plasma processing system, according to embodiments of the present disclosure.

Turning to FIG. 18, a graphical illustration of voltage at a beginning of a radio frequency pulse in a radio frequency plasma processing system, according to embodiments of the present disclosure is shown. Before discussing the accumulation of statistical data and how the data is used, an example of how a plus reaches a steady state is illustrated. In this illustration, the x-axis represents time in microseconds and the y-axis represents a unit measurement proportional to voltage. Thus, various measurements and calculations, such as slope, time to reach max voltage, time to reach steady state max voltage, and voltage at steady state. Such measurements may be performed for each and/or a plurality of pulses, which may thereby allow for averages for particular values, standard deviations for particular values, ramps, trends, and the like to be monitored. The acquisition and use of such measured values will not be discussed in detail. Using the above systems and methods, additional aspects of the present disclosure may allow for controlling the time it takes to establish plasma and the duration of the afterglow of the plasma. Control of the transients of turning on and off the RF power allows for more repeatable and reliable processing of wafers in a RF plasma processing system. For a well-established process, while the process may be relatively similar, the user obtains increased repeatability. Modifying a process may thereby make the transient duration change. Accordingly, separating both effect of time and effect of voltage allows for a clear picture of what is required to result in a successful process.

During normal operation power is provided from a generator to a matching network, as discussed in detail above. When power is turned off, such as during pulse processing, there is a greater amount of reflective power than forward power, so power is drawn back into the generator. This condition results in the chemistry, e.g., a mix of species that is present such as, for example, ions, radicals, atoms, and/or molecules about a wafer being different than the chemistry of the steady state of the pulse, which may be managed to result in beneficial consequences for the plasma process. The chemistry is different during the steady state of the pulse than during the afterglow, which makes pulsing beneficial, as the mix of particles is different during the different phases. Additionally, the period of time between when the power is turned off at the generator and when the residual power has left the matching network is not controlled. By controlling this period of time, a more stable processing environment may be established.

During operation, certain systems and methods may allow for changing the resonating aspects of the match at the time the RF is turned off. To adjust the resonating aspects to acceptable values, at approximately the time of an end of an RF pulse, the output of the match may be switched relatively quickly, such as within ten microseconds or less, to a known predicted additional load, either fixed or variable, such that decay of accumulated RF energy in the match will take a period of time that is defined by a user. In certain aspects, the output of the match may be switched even more quickly, such as less than seven microseconds, less than five microseconds, less than three microseconds, or less than about one microsecond. In certain implementations, the time the output is switched to a known additional load may occur at the end of the RF pulse, slightly before the end of the RF pulse, or slightly after the end of the RF pulse, depending on the requirements of the RF processing system.

Providing an additional load may thereby provide for a RF voltage on a plasma or wafer that matches a predetermined level of voltage that is desirable within a specific RF processing system. The desirable voltage may vary based on the operational dynamics of the system, preferences of a user, manufacturer of the RF processing system, components of the RF processing system, and other system and design variants.

In order to control the RF processing system to establish a desired RF voltage for a desired time, initially a determination of an end time of a radio frequency pulse may occur as seen in the reaction chamber. The radio frequency pulse includes a load that is applied within the radio frequency processing system, such as within a reaction chamber in accordance with the embodiments discussed above. The end time defines the time when the RF power is stopped, thereby changing the voltage being applied within the reaction chamber. In certain implementations, the end time may correspond to the end of a pulse and may include a slight delay from when power is turned off, such as a number of microseconds. As such, end time may be temporally relative depending on the operational dynamics of a specific RF processing system and/or components thereof.

In operation, the method may further include stopping the power applied to the RF processing system. "Stopping the power" refers to removing the application of voltage within the reaction chamber by, for example, turning off a generator connected to the reaction chamber.

In operation, the method may further include adjusting an additional load having a predetermined impedance applied to the radio frequency processing system in response to the determined end time. The additional load may be applied from a device separate from the generator or may include an additional aspect of the generator. For example, the additional load may be applied by adjusting an aspect of a switchable or variable component, such as a capacitor, which may be run in series or parallel with one or more of the generator and the matching network.

In certain embodiments, adjusting the additional load may occur slightly before the end point, such as several microseconds, 10 microseconds, 10-50 microseconds, or greater than 50 microseconds. Similarly, in other embodiments the adjusting the additional load may occur slightly after the end point, such as several microseconds, 10 microseconds, 10-50 microseconds, or greater than 50 microseconds. The timing of the adjusting the additional load may be based on operational aspects of the RF processing system, user input, manufacturer input, requirements of a process, and the like.

In operation, the method may further include determining a start point of a second RF pulse. The start point defines the beginning of the application of a load to the reaction chamber. The start point for the second RF pulse may occur microseconds after the end time of the first RF pulse. For example, the start point for the second RF pulse may occur several microseconds, 10 microsecond, 10-50 microseconds, 50-100 microseconds, or more than 100 microseconds after the end time of the first RF pulse. In certain implementations, the start point for the second RF pulse may occur 5 milliseconds, 10 milliseconds, 50 milliseconds, 100 milliseconds, more than 100 milliseconds from the end time of the first RF pulse.

Moreover, the determination of the start point may be dependent on a number of variables including, for example, the type of process, the type of generator, the type of matching network, the type of RF processing system, the requirements of a user, the requirements of the operation, the requirements of a manufacturer, and the like.

During operation, the method may further include stopping the additional load before the second radio frequency pulse occurs. When the condition within the reaction chamber reaches a desired state, the additional load may be removed, thereby allowing the condition within the reaction chamber to stabilize to the desired state. At a predefined period of time after the additional load is stopped, a second radio pulse having another load may be started within the reaction chamber, and the process defined above may be repeated until the processing operation is complete.

In certain implementations the value of the additional load may also be determined. In such an implementation, a method for determining the value of the additional load may include determining a plasma impedance when the load is disconnected. The value of the additional load may then be set to equal the determining plasma impedance.

With the value of the additional load set to equal determining plasma impedance, and before the power is turned on, the output of the matching network may be disconnected from the plasma and the additional load may be connected to the output of the matching network. The RF voltage may then be turned on. After a predefined time that the RF voltage is on, the plasma powering electrode may be switching on to the output of the matching network. At approximately the same time, the additional load is switched off. This process may be repeated to observe the transition from load to plasma.

At this point, the values of resistance and reactance of the impedance may be varied until the RF plasma processing system is optimized according to the requirements of, for example, a user, a process, and manufacturer, or the like. In certain implementations, the values of resistance and reactance of the impedance may be varied by approximately 10 percent, 10 to 20 percent, 20 to 50 percent, or greater than 50 percent.

Once the values of resistance and reactance of the impedance are established, production of wafers may continue, and subsequent switching may be performed by internal controls of the matching network.

Figure 19:
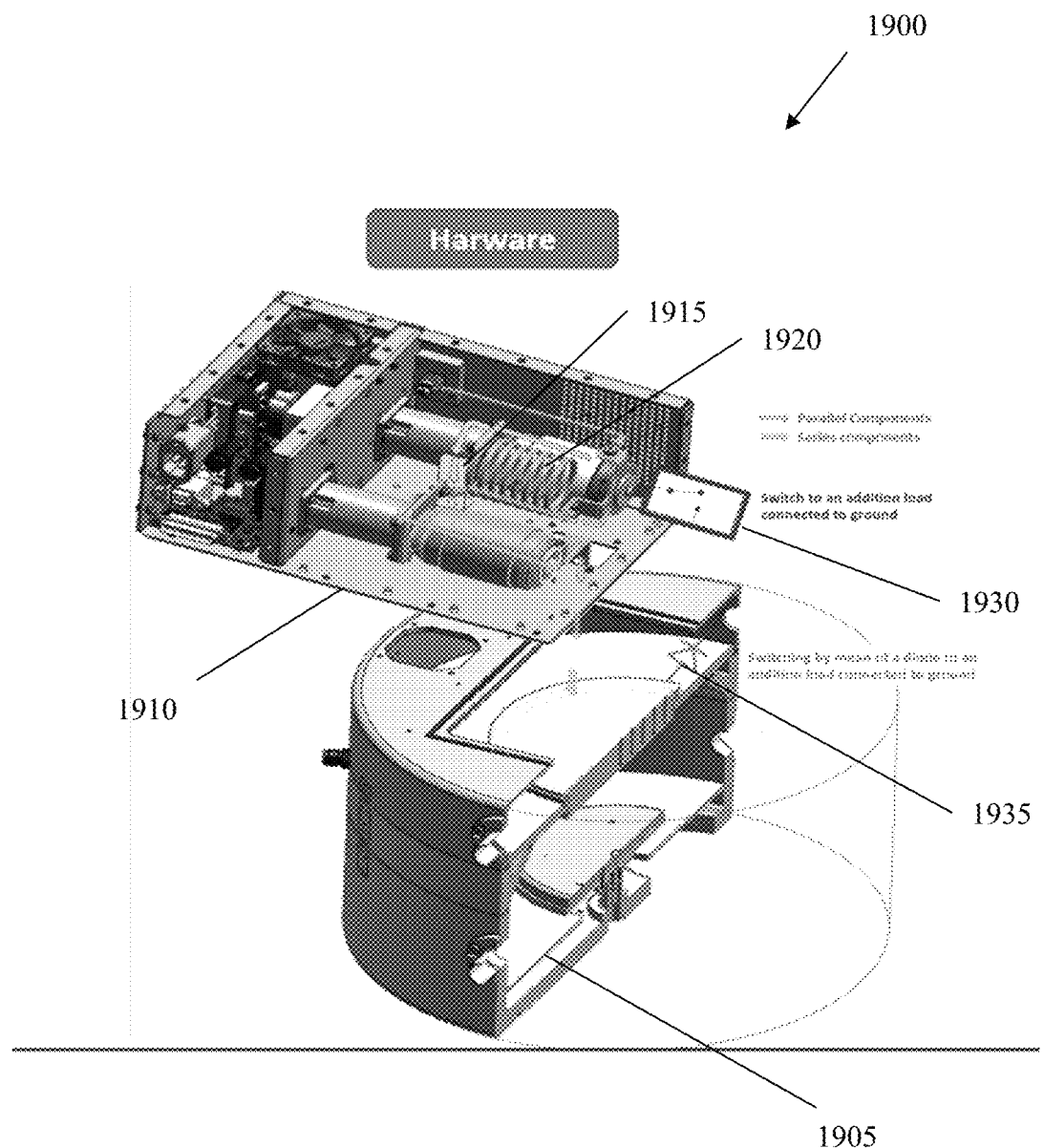
FIG. 19 is a cross-sectional view of a RF processing system according to embodiments of the present disclosure.

Referring to FIG. 19, a cross-sectional view of a RF processing system according to embodiments of the present disclosure is shown. In this embodiment, which may be used according to the methods described above, the RF processing system 1900 includes a reaction chamber 1905 and a matching network 1910 for applying a RF voltage to reaction chamber 1905. In this embodiment, a number of parallel components 1915 and series components 1920 are illustrated that may be used to provide an additional load to reaction chamber 1905. Examples of components that may be used to apply the additional load include, for example, variable vacuum capacitors, electronically variable capacitors, and pin-diode switchable capacitors. The additional load (not represented) may be located in the matching network 1910 between a ground and a switch 1930, or a diode 1935, or a fast-acting capacitor. This load can be located externally to matching network 1910, internally within matching network 1910 on reaction chamber 1905, about a powering electrode (not shown), connected by a switch 1930, a diode 1935, or a fast variable capacitor. Those of skill in the art having the benefit of this disclosure will appreciate that any type of component that may apply the additional load to reaction chamber 1905 may be used according to embodiments disclosed herein.

Figure 20:
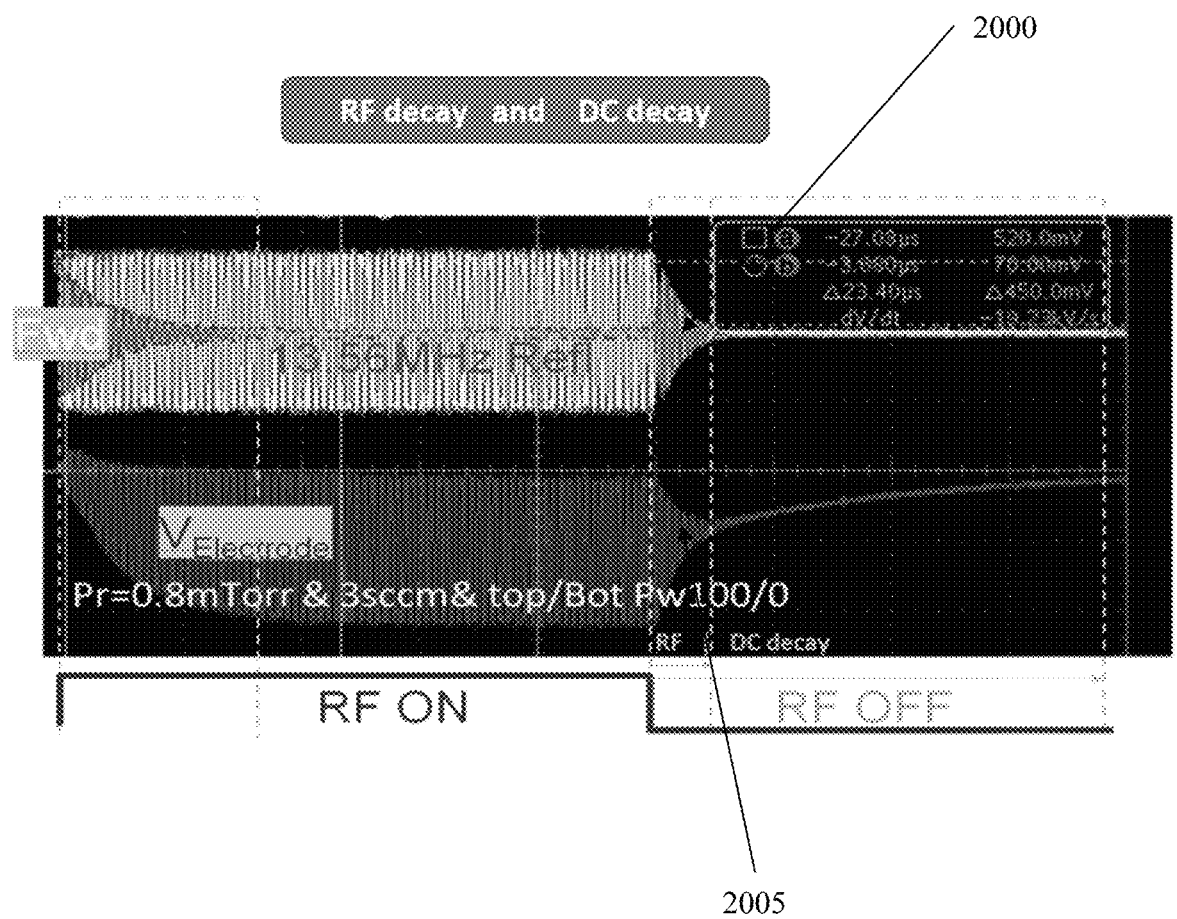
FIG. 20 is a RF and DC decay process diagram for a RF plasma processing system matching network according to embodiments of the present disclosure.

Referring to FIG. 20, a RF and DC decay process diagram for a RF plasma processing system matching network, according to embodiments of the present disclosure are shown. The process diagram illustrates the RF decay 2000 during the end of a RF pulse. The process diagram further illustrates the DC decay 2005 at the end of a RF pulse. As discussed above, the decay can be controlled by introducing an additional load that results in a decay pattern that is desirable for a particular process. For example, in certain implementation, it may be desirable to obtain a flat decay profile, while in other implementations the decay may be controlled according to a predefined value, as discussed in detail above.

By adding switchable loads on the output of a matching network, the time the RF power takes to leave the match may be modified, thereby allowing the time for the plasma to extinguish to also me modified to a desired time.

Figure 21:
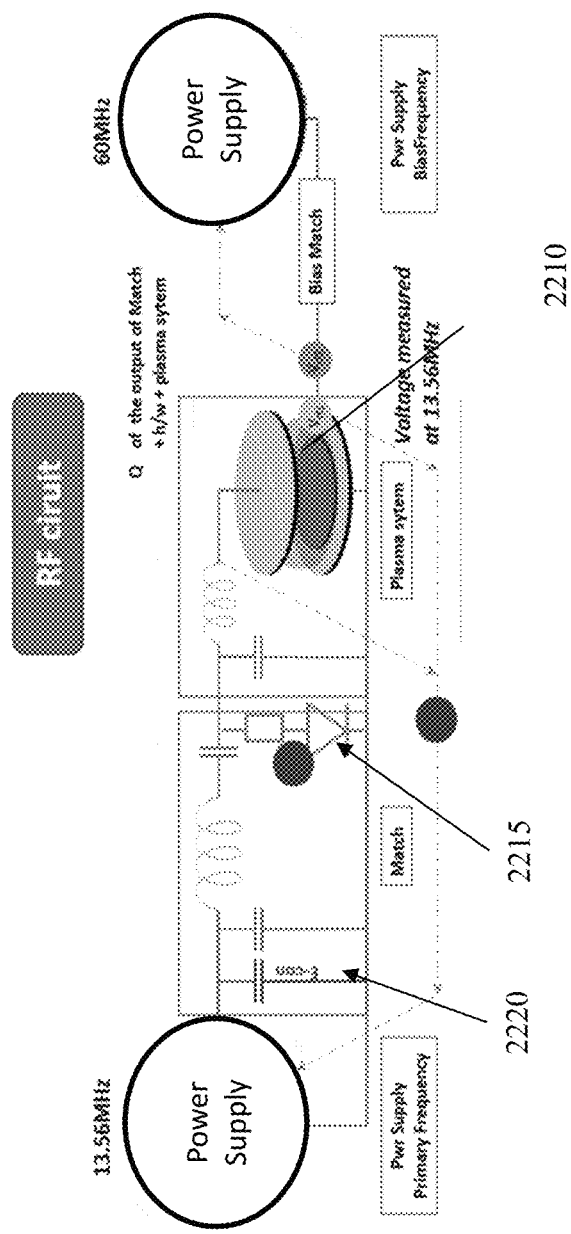
FIG. 21 is a schematic representation of where a switchable component to add an additional load may be located according to embodiments of the present disclosure.

Referring to FIG. 21 a schematic representation of where a switchable component to add an additional load according to embodiments of the present disclosure is shown. As illustrated, a matching network 2200 is connected to the rest of a RF plasma processing system 2205, which contains a reaction chamber 2210. In this embodiment, matching network 2200 includes a switchable component 2215, that may be turned on an off to adjust an additional load applied within reaction chamber 2210. In this implementation, switchable component 2215 is connected after a number of capacitors 2220, in line before exiting matching network 2200 to RF plasma processing system 2205. In other implementations, switchable component 2215 may be located external to matching network 2200 or at a different location within matching network 2200 circuitry.

In still other embodiments of the present disclosure, other methods of controlling a RF processing system may be used. By changing the value of one of the capacitors in a matching network away from an optimum tuned position, the time the plasma reaches a steady state may be increased. Such an adjust may cause a higher reflected power, which can be compensated for by deliver higher power. The voltage on a wafer electrode may also be modulated so that the voltage on the wafer level will be substantially continuous for a period or otherwise have a voltage shape that is desirable to a user.

In operation, such methods may include determining a first capacitor value and a second capacitor value for a RF plasma process. The capacitor values may refer to the values provided to the RF plasma processing system and may automatically be determined based on particular aspects of the process, such as desired loads within the reaction chamber. The method further includes measuring a powering electrode maximum voltage and a wafer electrode maximum voltage.

After the values are determined and/or measured, the method may include changing at least one of the first capacitor value and the second capacitor value to reach the wafer electrode maximum voltage. Subsequently, the method may include determining a control voltage where the control voltage is based on the changing at least one of the first capacitor value and the second capacitor value to reach the wafer electrode maximum voltage.

After the control voltage is converted, the control voltage may be sent to a generator to deliver more or less power when a determined voltage on the wafer is lower than a predefined value. The predefined value may be defined in accordance with a user specification, a process requirement, manufacturers suggestion, and the like. In certain embodiments the control voltage to the generator to deliver more or less power when a determined voltage on the wafer is lower than the predefined value results in an approximately constant voltage applied to the wafer. In other embodiments, sending the control voltage to the generator to deliver more or less power when a determined voltage on the wafer is lower than the predefined value results in a voltage on the wafer than varies as a function of time.

In operation more or less power may be delivered to the wafer when the voltage is low, thereby resulting in a flat, i.e., constant, value of voltage on the wafer. In certain implementations, a user may determine that rather than a flat voltage, it is more desirable to have a ramped voltage or another type of process curve that is a function of time.

In certain typical implementations the matching network may include a tank circuit. A tank circuit refers to a parallel combination of a capacitor and an inductor. Thus, when the RF voltage is turned on, it may take a certain period of time for the matching network, in this embodiment the tank circuit, to fill in. Another type of delay may occur with the establish of the plasma. In typical RF plasma processing system, the cause of the delay may be considered not controllable.

Embodiments of the present disclosure may alleviate the delay issues in such circuits by changing how fast the tank circuit is filled in. Said another way, the tank circuit can be filled in by connecting the output of the matching network to a known fixed or variable load. Once the tank is filled in, the output can be switched from the load to the plasma. The double-switching, i.e., switching off the load and switching on the plasma may be either synchronous or asynchronous. The additional load has an impedance, i.e., resistance and reactance of the impedance, that may be selected to be approximately equivalent to the impedance of the plasma.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method of controlling a radio frequency processing system, the method comprising:
    determining an end time of a radio frequency pulse comprising a first load;
    stopping a power applied to the radio frequency processing system based on the determined end time of the radio frequency pulse;
    adjusting an additional load having a predetermined impedance applied to the radio frequency processing system in response to the determined end time;
    determining a start point of a second radio frequency pulse; and
    disconnecting the additional load before the determined start point of the second radio frequency pulse and the second radio frequency pulse occurs.

2. The method of claim 1, wherein the adjusting the additional load having a predetermined impedance applied to the radio frequency processing system in response to the determined end time occurs before the end of the radio frequency pulse.

3. The method of claim 2, wherein the adjusting occurs within about 50 microseconds before the end of the radio frequency pulse.

4. The method of claim 1, wherein the adjusting the additional load having an impedance to have a response matching the determined end time.

5. The method of claim 4, wherein the adjusting occurs within about 50 microseconds after the end of the radio frequency pulse.

6. The method of claim 4, wherein the adjusting occurs within less than about 5 microseconds after the end of the radio frequency pulse.

7. The method of claim 1, wherein the adjusting the additional load having a predetermined impedance to has a response matching the determined end time changes a resonance in the radio frequency processing system.

8. The method of claim 1, further comprising determining a plasma impedance when the additional load is disconnected.

9. The method of claim 8, further comprising setting a value of the additional load to be equal to the plasma impedance.

10. The method of claim 9, further comprising varying a resistance and a reactance of an impedance.

11. The method of claim 10, wherein the varying comprises varying the resistance and the reactance of an impedance by about 10 percent or greater.

* * * * *